(12) United States Patent
Yuan

(10) Patent No.: US 12,538,686 B2
(45) Date of Patent: Jan. 27, 2026

(54) LIGHT-EMITTING SUBSTRATE AND MANUFACTURING METHOD THEREOF, AND LIGHT-EMITTING APPARATUS

(71) Applicant: BOE TECHNOLOGY GROUP CO., LTD., Beijing (CN)

(72) Inventor: Xu Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 316 days.

(21) Appl. No.: 18/042,667

(22) PCT Filed: Jan. 20, 2022

(86) PCT No.: PCT/CN2022/073046
§ 371 (c)(1),
(2) Date: Feb. 23, 2023

(87) PCT Pub. No.: WO2023/137668
PCT Pub. Date: Jul. 27, 2023

(65) Prior Publication Data
US 2024/0284742 A1    Aug. 22, 2024

(51) Int. Cl.
*H10K 59/35* (2023.01)
*H10K 50/115* (2023.01)
*H10K 59/12* (2023.01)
*H10K 101/30* (2023.01)
*H10K 102/00* (2023.01)

(52) U.S. Cl.
CPC ......... *H10K 59/353* (2023.02); *H10K 50/115* (2023.02); *H10K 59/1201* (2023.02); *H10K 2101/30* (2023.02); *H10K 2102/351* (2023.02)

(58) Field of Classification Search
CPC . H10K 59/1201; H10K 59/353; H10K 50/115
See application file for complete search history.

(56) References Cited

U.S. PATENT DOCUMENTS

| 2005/0168140 | A1* | 8/2005 | Nakamura | ............ | H05B 33/22 |
| | | | | | 313/506 |
| 2006/0246293 | A1* | 11/2006 | Iizumi | ................. | H10K 77/10 |
| | | | | | 313/506 |

(Continued)

FOREIGN PATENT DOCUMENTS

| CN | 105336879 A | 2/2016 |
| CN | 107611021 A | 1/2018 |

(Continued)

OTHER PUBLICATIONS

International Search Report (with English Translation) and Written Opinion for corresponding PCT Application No. PCT/CN2022/073046, dated Oct. 10, 2022, 11 pages.

(Continued)

*Primary Examiner* — Joseph C. Nicely
(74) *Attorney, Agent, or Firm* — Dority & Manning, P.A.

(57) ABSTRACT

A light-emitting substrate includes a plurality of light-emitting devices including at least one first light-emitting device. Each light-emitting device includes a light-emitting pattern The first light-emitting device further includes a first material layer including a first material A material of a light-emitting pattern included in first light-emitting device includes a first light-emitting material. The first material is capable of generating a second material under light irradiation of a first wavelength band, and a solubility of the first material and a solubility of the first light-emitting material are each different from a solubility of the second material in a same solvent; or the first material is generated by a third material under light irradiation of a second wavelength band, and a solubility of the first material and a solubility of the first light-emitting material are each different from a solubility of the second material er the third material in a same solvent.

20 Claims, 10 Drawing Sheets

(56) References Cited

U.S. PATENT DOCUMENTS

| | | | |
|---|---|---|---|
| 2009/0085473 A1* | 4/2009 | Iizumi | H10K 71/12 313/504 |
| 2009/0087792 A1 | 4/2009 | Iizumi et al. | |
| 2010/0108984 A1 | 5/2010 | Cho et al. | |
| 2016/0351842 A1 | 12/2016 | Park et al. | |
| 2018/0149970 A1 | 5/2018 | Lee et al. | |
| 2019/0229162 A1* | 7/2019 | Shin | H10K 71/191 |
| 2021/0066673 A1* | 3/2021 | Zhang | H10K 71/441 |
| 2022/0127525 A1 | 4/2022 | Wang | |
| 2022/0140271 A1* | 5/2022 | Li | C09K 11/06 257/13 |
| 2024/0237380 A1* | 7/2024 | Mei | H10K 59/35 |

FOREIGN PATENT DOCUMENTS

| | | |
|---|---|---|
| CN | 107799672 A | 3/2018 |
| CN | 110838506 A | 2/2020 |
| CN | 111682115 A | 9/2020 |
| CN | 111769200 A | 10/2020 |
| CN | 111900269 A | 11/2020 |
| CN | 112310291 A | 2/2021 |
| CN | 112750954 A | 5/2021 |
| CN | 112885969 A | 6/2021 |
| CN | 112952014 A | 6/2021 |
| CN | 113130775 A | 7/2021 |
| CN | 113193133 A | 7/2021 |
| CN | 113745439 A | 12/2021 |
| CN | 113871544 A | 12/2021 |
| CN | 113903873 A | 1/2022 |
| CN | 113950753 A | 1/2022 |

OTHER PUBLICATIONS

Chinese First Office Action (with English translation) for corresponding Application No. CN202280000038.1, dated Nov. 25, 2025, 28 pages.

* cited by examiner

LIGHT-EMITTING SUBSTRATE AND MANUFACTURING METHOD THEREOF, AND LIGHT-EMITTING APPARATUS

CROSS-REFERENCE TO RELATED APPLICATION

This application is a national phase entry under 35 USC 371 of International Patent Application No. PCT/CN 2022/073046 filed on Jan. 20, 2022, which is incorporated herein by reference in its entirety.

TECHNICAL FIELD

The present disclosure relates to the field of lighting and display technologies, and in particular, to a light-emitting substrate and a manufacturing method thereof, and a light-emitting apparatus.

BACKGROUND

Compared with organic light-emitting materials, quantum dots have the advantages of high light-emitting color purity and adjustable light-emitting wavelength, and have excellent photochemical stability and thermal stability. Therefore, quantum dot light-emitting diodes using quantum dots as light-emitting materials are widely used in the display field.

SUMMARY

In an aspect, a light-emitting substrate is provided. The light-emitting substrate includes a substrate and a plurality of light-emitting devices disposed on the substrate. Each light-emitting device includes a first electrode, a second electrode, and a light-emitting pattern disposed between the first electrode and the second electrode, and the first electrode is closer to the substrate than the second electrode. The plurality of light-emitting devices include at least one first light-emitting device, and the at least one first light-emitting device further includes a first material layer. The first material layer is disposed on a side, proximate to the substrate, of a light-emitting pattern included in the at least one first light-emitting device, and is in contact with the light-emitting pattern included in the at least one first light-emitting device. A material of the light-emitting pattern included in the at least one first light-emitting device includes a first light-emitting material, and a material of the first material layer includes a first material. The first material is capable of generating a second material under light irradiation of a first wavelength band, and a solubility of the first material and a solubility of the first light-emitting material are each different from a solubility of the second material in a same solvent; or the first material is generated by a third material under light irradiation of a second wavelength band, and a solubility of the first material and a solubility of the first light-emitting material are each different from a solubility of the third material in a same solvent.

In some embodiments, an electron mobility of the first material is in a range of $1 \times 10^4$ cm$^2$/V·s to $2 \times 10^{-3}$ cm$^2$/V·s, inclusive, and an absolute value of a lowest unoccupied molecular orbital (LUMO) energy level of the first material is in a range of 3.6 eV to 4.2 eV, inclusive; or a hole mobility of the first material is in a range of $1 \times 10^4$ cm$^2$/V·s to $2 \times 10^{-3}$ cm$^2$/V·s, inclusive, and an absolute value of a highest occupied molecular orbital (HOMO) energy level of the first material is in a range of 5.1 eV to 6.2 eV, inclusive.

In some embodiments, the at least one first light-emitting device further includes a carrier transport layer. The carrier transport layer is disposed on a side of the first material layer proximate to the substrate, and is in contact with the first material layer; or the first material layer serves as the carrier transport layer, and is in direct contact with a first electrode included in the at least one first light-emitting device.

In some embodiments, in a case where the at least one first light-emitting device further includes the carrier transport layer, a thickness of the first material layer is less than a thickness of the carrier transport layer. In a case where the first material layer serves as the carrier transport layer, the thickness of the first material layer is in a range of 50 nm to 70 nm, inclusive.

In some embodiments, in a case where the at least one first light-emitting device further includes the carrier transport layer, and the material of the first material layer has a carrier transport function, a thickness of the first material layer is in a range of 5 nm to 20 nm, inclusive, and a thickness of the carrier transport layer is in a range of 50 nm to 70 nm, inclusive.

In some embodiments, the first material and the first light-emitting material each include metal nanoparticles and ligands bound to the metal nanoparticles. The ligands included in the first material are same as or different from the ligands included in the first light-emitting material. In a case where the ligands included in the first material are the same as the ligands included in the first light-emitting material, ligands included in the third material are photosensitive ligands. In a case where the ligands included in the first material are different from the ligands included in the first light-emitting material, the ligands included in the first light-emitting material are non-photosensitive ligands, and a solubility of the non-photosensitive ligands is different from the solubility of the second material in the same solvent, or the solubility of the non-photosensitive ligands is different from the solubility of the third material in the same solvent.

In some embodiments, the photosensitive ligands include ligands capable of undergoing a decomposition reaction or a crosslinking reaction under light irradiation.

In some embodiments, a photosensitive ligand in the photosensitive ligands includes any one of 2-(Boc-amino) ethanethiol and Mono-2-(Methacryloyloxy)ethyl succinate (MMES).

In some embodiments, in a case where the at least one first light-emitting device further includes the carrier transport layer, a material of the carrier transport layer includes metal nanoparticles and ligands bound to the metal nanoparticles. The metal nanoparticles included in the material of the carrier transport layer are same as or different from the metal nanoparticles included in the first material, and the ligands included in the material of the carrier transport layer are different from the ligands included in the first material.

In some embodiments, the plurality of light-emitting devices further include at least one second light-emitting device, and the at least one second light-emitting device further includes a second material layer. The second material layer is disposed on a side, proximate to the substrate, of a light-emitting pattern included in the at least one second light-emitting device, and is in contact with the light-emitting pattern included in the at least one second light-emitting device. A material of the light-emitting pattern included in the at least one second light-emitting device includes a second light-emitting material, and a material of the second material layer includes a fourth material. The fourth material is capable of generating a fifth material under light irradiation of a third wavelength band, and a solubility of the fourth material and a solubility of the second light-emitting material are each different from a solubility of the fifth material in a same solvent; or the fourth material is generated by a sixth material under light irradiation of a fourth wavelength band, and a solubility of the fourth material and a solubility of the second light-emitting material are each different from a solubility of the sixth material in a same solvent.

In some embodiments, the at least one second light-emitting device further includes a third material layer. The third material layer is disposed on a side of the second material layer proximate to the substrate, and is in a same layer as the first material layer. A thickness of the third material layer is less than a thickness of the first material layer.

In some embodiments, the at least one first light-emitting device further includes a fourth material layer. The fourth material layer is disposed on a side, away from the substrate, of the light-emitting pattern included in the at least one first light-emitting device, and is in contact with the light-emitting pattern included in the at least one first light-emitting device. A thickness of the fourth material layer is less than a thickness of the second material layer.

In some embodiments, the plurality of light-emitting devices further include at least one third light-emitting device, and the at least one third light-emitting device further includes a fifth material layer. The fifth material layer is disposed on a side, proximate to the substrate, of a light-emitting pattern included in the at least one third light-emitting device, and is in contact with the light-emitting pattern included in the at least one third light-emitting device. A material of the light-emitting pattern included in the at least one third light-emitting device includes a third light-emitting material, and a material of the fifth material layer includes a seventh material. The seventh material is capable of generating an eighth material under light irradiation of a fifth wavelength band, and a solubility of the seventh material and a solubility of the third light-emitting material are each different from a solubility of the eighth material in a same solvent; or the seventh material is generated by a ninth material under light irradiation of a sixth wavelength band, and a solubility of the seventh material and a solubility of the third light-emitting material are each different from a solubility of the ninth material in a same solvent.

In some embodiments, the at least one third light-emitting device further includes a sixth material layer. The sixth material layer is disposed on a side of the fifth material layer proximate to the substrate, and is in a same layer as the first material layer. A thickness of the sixth material layer is less than a thickness of the first material layer.

In some embodiments, the at least one third light-emitting device further includes a seventh material layer. The seventh material layer is disposed on a side of the fifth material layer proximate to the substrate, and is in a same layer as the second material layer. A thickness of the seventh material layer is less than a thickness of the second material layer.

In some embodiments, the at least one first light-emitting device further includes an eighth material layer. The eighth material layer is disposed on a side, away from the substrate, of the light-emitting pattern included in the at least one first light-emitting device, and is in a same layer as the fifth material layer. A thickness of the eighth material layer is less than a thickness of the fifth material layer.

In some embodiments, the at least one second light-emitting device further includes a ninth material layer. The ninth material layer is disposed on a side, away from the substrate, of the light-emitting pattern included in the at least one second light-emitting device, and is in a same layer as the fifth material layer. A thickness of the ninth material layer is less than a thickness of the fifth material layer.

In some embodiments, for light-emitting devices with different light-emitting colors in the plurality of light-emitting devices, in a case where material layers, which are respectively in contact with light-emitting patterns included in the light-emitting devices with different light-emitting colors and respectively disposed on sides, proximate to the substrate, of the light-emitting patterns included in the light-emitting devices with different light-emitting colors, each include metal nanoparticles and ligands bound to the metal nanoparticles, the metal nanoparticles included in each material layer are same, and at least one material layer includes metal nanoparticles doped with other at least one metal.

In some embodiments, the metal nanoparticles included in each material layer are zinc oxide nanoparticles, and the metal nanoparticles included in the at least one material layer are doped with magnesium metal.

In some embodiments, the metal nanoparticles included in each material layer are doped with magnesium metal with a different doping amount.

In another aspect, a light-emitting apparatus is provided. The light-emitting apparatus includes the light-emitting substrate described above.

In yet another aspect, a manufacturing method of a light-emitting substrate is provided. The manufacturing method includes as follows.

A plurality of light-emitting devices are formed on a substrate. Each light-emitting device includes a first electrode, a second electrode, and a light-emitting pattern formed between the first electrode and the second electrode, and the first electrode is closer to the substrate than the second electrode. The plurality of light-emitting devices include at least one first light-emitting device, and the at least one first light-emitting device further includes a first material layer. The first material layer is formed on a side, proximate to the substrate, of a light-emitting pattern included in the at least one first light-emitting device, and is in contact with the light-emitting pattern included in the at least one first light-emitting device. A material of the light-emitting pattern included in the at least one first light-emitting device includes a first light-emitting material, and a material of the first material layer includes a first material. The first material is capable of generating a second material under light irradiation of a first wavelength band, and a solubility of the first material and a solubility of the first light-emitting material are each different from a solubility of the second material in a same solvent; or the first material is generated by a third material under light irradiation of a second wavelength band, and a solubility of the first material and a solubility of the first light-emitting material are each different from a solubility of the third material in a same solvent.

In some embodiments, the first material is generated by the third material under the light irradiation of the second wavelength band, and a solubility of the first material and a solubility of the first light-emitting material in a first solvent are each less than a solubility of the third material in the first solvent; forming the at least one first light-emitting device, includes following steps.

A first film and a second film are sequentially formed on the substrate. A material of the first film includes the third material. A material of the second film includes the first light-emitting material; or the material of the second film includes a tenth material that is capable of generating the first light-emitting material under the light irradiation of the second wavelength band.

A portion of the first film and a portion of the second film that are located in a first region are irradiated by using light of the second wavelength band, so that the portion of the first film located in the first region generates the first material. The first region is a region where the at least one first light-emitting device is located.

A portion of the first film located in a second region is dissolved by using the first solvent, so as to remove the portion of the first film located in the second region and a portion of the second film located in the second region, so that the first material layer and the light-emitting pattern included in the at least one first light-emitting device are obtained. The second region is a remaining region of the plurality of light-emitting devices except the region where the at least one first light-emitting device is located.

In some embodiments, the first material and the first light-emitting material each include metal nanoparticles and ligands bound to the metal nanoparticles. The ligands included in the first material are same as or different from the ligands included in the first light-emitting material. In a case where the ligands included in the first material are different from the ligands included in the first light-emitting material, the ligands included in the first light-emitting material are insoluble in the first solvent.

In some embodiments, in a case where the ligands included in the first material are the same as the ligands included in the first light-emitting material, the first light-emitting material is generated by the tenth material under the light irradiation of the second wavelength band; and ligands included in the third material are photosensitive ligands, and ligands included in the tenth material are photosensitive ligands. In the case where the ligands included in the first material are different from the ligands included in the first light-emitting material, the ligands included in the third material are photosensitive ligands, and the material of the second film includes the first light-emitting material.

In some embodiments, the photosensitive ligands include ligands capable of undergoing a decomposition reaction or a crosslinking reaction under the light radiation of the second wavelength band.

In some embodiments, a photosensitive ligand in the photosensitive ligands includes any one of 2-(Boc-amino) ethanethiol and Mono-2-(Methacryloyloxy)ethyl succinate (MMES).

In some embodiments, the plurality of light-emitting devices further include at least one second light-emitting device, and the at least one second light-emitting device further includes a second material layer. The second material layer is formed on a side, proximate to the substrate, of a light-emitting pattern included in the at least one second light-emitting device, and is in contact with the light-emitting pattern included in the at least one second light-emitting device. A material of the light-emitting pattern included in the at least one second light-emitting device includes a second light-emitting material, and a material of the second material layer includes a fourth material. The fourth material is capable of generating a fifth material under light irradiation of a third wavelength band, and a solubility of the fourth material and a solubility of the second light-emitting material are each different from a solubility of the fifth material in a same solvent; or the fourth material is generated by a sixth material under light irradiation of a fourth wavelength band, and a solubility of the fourth material and a solubility of the second light-emitting material are each different from a solubility of the sixth material in a same solvent.

In some embodiments, the fourth material is generated by the sixth material under the light irradiation of the fourth wavelength band, and a solubility of the fourth material and a solubility of the second light-emitting material in a second solvent are each less than a solubility of the sixth material in the second solvent; forming the at least one second light-emitting device, includes following steps.

A third film and a fourth film are sequentially formed on the substrate on which the first material layer and the light-emitting pattern included in the at least one first light-emitting device are formed. A material of the third film includes the sixth material. A material of the fourth film includes the second light-emitting material; or the material of the fourth film includes an eleventh material that is capable of generating the second light-emitting material under the light irradiation of the fourth wavelength band.

A portion of the third film and a portion of the fourth film that are located in a third region are irradiated by using light of the fourth wavelength band, so that the portion of the third film located in the third region generates the fourth material. The third region is a region where the at least one second light-emitting device is located.

A portion of the third film located in a fourth region is dissolved by using the second solvent, so as to remove the portion of the third film located in the fourth region and a portion of the fourth film located in the fourth region, so that the second material layer and the light-emitting pattern included in the at least one second light-emitting device are obtained. The fourth region is a remaining region of the plurality of light-emitting devices except the region where the at least one second light-emitting device is located.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
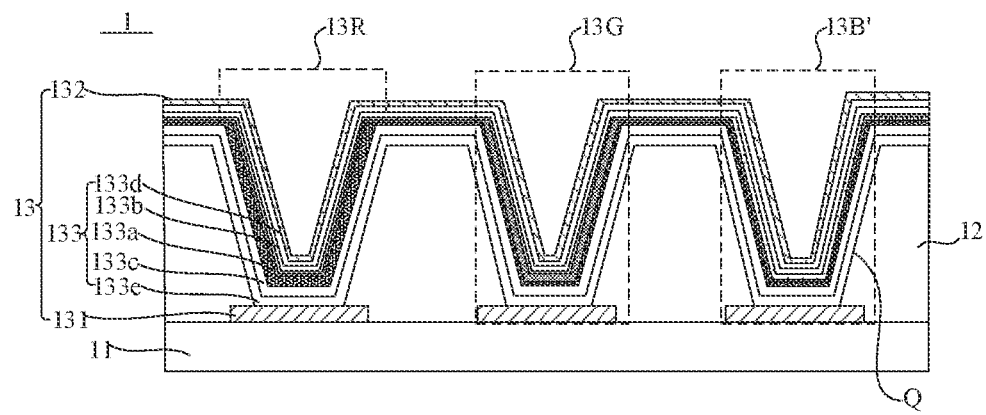
FIG. 1 is a sectional view of a light-emitting substrate, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of the phrase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a light-emitting apparatus. The light-emitting apparatus includes a light-emitting substrate. Of course, the light-emitting apparatus may further include other components, such as a circuit for providing electrical signals to the light-emitting substrate to drive the light-emitting substrate to emit light. The circuit may be referred to as a control circuit, and may include a circuit board and/or an integrated circuit (IC) electrically connected to the light-emitting substrate.

In some embodiments, the light-emitting apparatus may be a lighting apparatus, and in this case, the light-emitting apparatus serves as a light source to realize a lighting function. For example, the light-emitting apparatus may be a backlight module in a liquid crystal display apparatus, a lamp for internal or external lighting, or a signal lamp.

In some other embodiments, the light-emitting apparatus may be a display apparatus, and in this case, the light-emitting substrate is a display substrate for realizing a function of displaying an image (i.e., picture). The light-emitting apparatus may include a display or a product including a display. The display may be a flat panel display (FPD), or a microdisplay. The display may be a transparent display or an opaque display, depending on whether a user can see a scene behind the display. The display may be a flexible display or a normal display (which may be referred to as a rigid display), depending on whether the display is bendable or rollable. For example, the product including the display may be a computer display, a television, a billboard, a laser printer with a display function, a telephone, a mobile phone, a personal digital assistant (PDA), a laptop computer, a digital camera, a camcorder, a viewfinder, a vehicle, a large area wall screen, a theater screen, or a stadiumsign.

Figure 2:
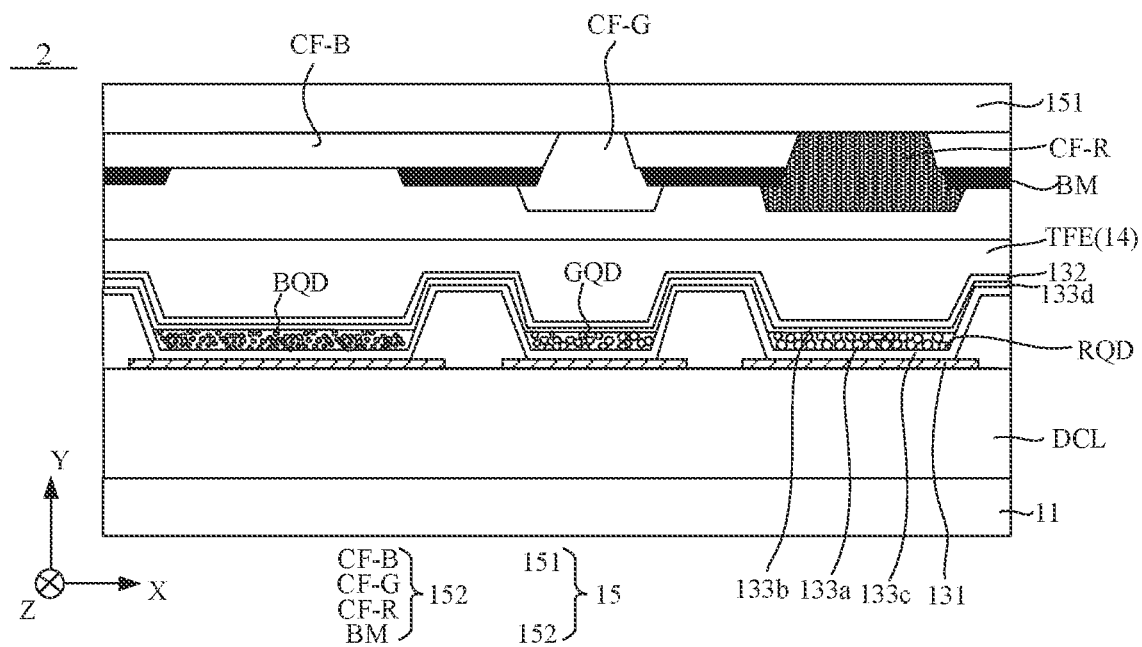
FIG. 2 is another sectional view of a light-emitting substrate, in accordance with some embodiments.

Some embodiments of the present disclosure provide the light-emitting substrate 1. As shown in FIGS. 1 and 2, the light-emitting substrate 1 includes a substrate 11, and a driving circuit layer DCL, a pixel defining layer 12 and light-emitting devices 13 that are all disposed on the substrate 11. The pixel defining layer 12 has openings Q. A plurality of light-emitting devices 13 may be arranged in one-to-one correspondence with a plurality of openings Q. Here, the plurality of light-emitting devices 13 may be all or part of the light-emitting devices 13 included in the light-emitting substrate 1, and the plurality of openings Q may be all or part of the openings in the pixel defining layer 12.

In some embodiments, as shown in FIGS. 1 and 2, each light-emitting device 13 includes a first electrode 131, a second electrode 132, and a light-emitting functional layer 133 disposed between the first electrode 131 and the second electrode 132. The light-emitting functional layer 133 includes a light-emitting pattern 133*a*. The first electrode 131 is closer to the substrate 11 than the second electrode 132.

In some embodiments, the substrate 11 may be a layer made of an inorganic material, an organic material, a silicon wafer, or a composite material.

The inorganic material may be, for example, glass or metal. The organic material may be, for example, polycarbonate, polymethyl methacrylate, polyethylene terephthalate, polyethylene naphthalate, polyamide, polyethersulfone, or a combination thereof.

In some embodiments, the first electrode 131 may be an anode, and in this case, the second electrode 132 is a cathode. In some other embodiments, the first electrode 131 may be a cathode, and in this case, the second electrode 132 is an anode.

The light-emitting principle of the light-emitting device 13 is as follows. Through a circuit in which the anode and the cathode are connected, the anode injects holes into the light-emitting functional layer 133, and the cathode injects electrons into the light-emitting functional layer 133, so that the formed electrons and holes form excitons in the light-emitting pattern 133*a*, and the excitons transition back to a ground state by radiation to emit photons.

In some embodiments, the anode may include conductor(s) having a high work function, such as a metal, a conductive metal oxide, or a combination thereof. The metal may be nickel, platinum, vanadium, chromium, copper, zinc or gold, or an alloy thereof. The conductive metal oxide may be zinc oxide, indium oxide, tin oxide, indium tin oxide (ITO), indium zinc oxide (IZO), or fluorine-doped tin oxide. Alternatively, the combination of the metal and the conductive metal oxide may be ZnO and Al, or $SnO_2$ and Sb, or ITO/Ag/ITO, but is not limited thereto.

The cathode may include conductor(s) having a lower work function than the anode, such as at least one of a metal, a conductive metal oxide and a conductive polymer. The cathode may include metal. For example, the metal may be aluminum, magnesium, calcium, sodium, potassium, titanium, indium, yttrium, lithium, gadolinium, silver, tin, lead, cesium or barium, or an alloy thereof. A multi-layer structure thereof is, for example, LiF/Al, $Li_2O$/Al, Liq/Al, LiF/Ca, or $BaF_2$/Ca. The conductive metal oxide may be zinc oxide, indium oxide, tin oxide, indium tin oxide (ITO), indium zinc oxide (IZO), or fluorine-doped tin oxide, but is not limited thereto.

The work function of the anode may be higher than the work function of the cathode. For example, the work function of the anode may be in a range of about 4.5 eV to about 5.0 eV, and the work function of the cathode may be in a range of about 4.0 eV to about 4.7 eV. In these ranges, the work function of the anode may, for example, be in a range of about 4.6 eV to about 4.9 eV or in a range of about 4.6 eV to about 4.8 eV, and the work function of the cathode may, for example, be in a range of about 4.0 eV to about 4.6 eV or in a range of about 4.3 eV to about 4.6 eV.

The first electrode 131 and the second electrode 132 each may be a transmissive electrode, a partially transmissive and partially reflective electrode, or a reflective electrode. The transmissive electrode or the partially transmissive and partially reflective electrode may include a conductive oxide, such as zinc oxide, indium oxide, tin oxide, indium tin oxide (ITO), indium zinc oxide (IZO), or fluorine-doped tin oxide, or may include a metal thin layer. The reflective electrode may include a reflective metal such as an opaque conductor, e.g., aluminum (Al), silver (Ag), or gold (Au). The first electrode 131 and the second electrode 132 each may have a single-layer structure or a multi-layer structure.

At least one of the first electrode 131 or the second electrode 132 may be connected to an auxiliary electrode. If the at least one of the first electrode 131 or the second electrode 132 is connected to the auxiliary electrode, a resistance of the second electrode 132 may be reduced.

In some embodiments, the light-emitting substrate 1 may be a top-emission light-emitting substrate or a bottom-emission light-emitting substrate.

In a case where the light-emitting substrate 1 is the top-emission light-emitting substrate, the second electrode 132 may be the transmissive electrode, and the first electrode 131 may be the reflective electrode. In a case where the light-emitting substrate 1 is the bottom-emission light-emitting substrate, the first electrode 131 is the transmissive electrode, and the second electrode 132 is the reflective electrode.

Of course, in some embodiments, the light-emitting substrate 1 may be a double-sided emission light-emitting substrate, and in this case, the first electrode 131 and the second electrode 132 are the transmissive electrodes.

In some other embodiments, the light-emitting device 13 may be an "upright" light-emitting device or an "inverted" light-emitting device.

In a case where the light-emitting device 13 is the "upright" light-emitting device, the first electrode 131 is the anode, and the second electrode 132 is the cathode. In a case where the light-emitting device 13 is the "inverted" light-emitting device, the first electrode 131 is the cathode, and the second electrode 132 is the anode.

As shown in FIGS. 1 and 2, in order to improve the efficiency of injecting the electrons and the holes into the light-emitting pattern 133*a*, the light-emitting functional layer 133 may further include at least one of a hole transport layer (HTL) 133*b*, an electronic transport layer (ETL) 133*c*, a hole injection layer (HIL) 133*d*, and an electronic injection layer (EIL) 133*e*. For example, the light-emitting functional layer 133 may include the hole transport layer (HTL) 133*b* disposed between the anode and the light-emitting pattern 133*a*, and the electron transport layer (ETL) 133*c* disposed between the cathode and the light-emitting pattern 133*a*. In order to further improve the efficiency of injecting the electrons and the holes into the light-emitting pattern 133*a*, the light-emitting functional layer 133 may further include the hole injection layer (HIL) 133*d* disposed between the anode and the hole transport layer 133*b*, and the electron injection layer (EIL) 133*e* disposed between the cathode and the electron transport layer 133*c*.

The driving circuit layer DCL connected to the light-emitting devices 13 may be disposed in the light-emitting substrate 1. The driving circuit layer DCL includes pixel driving circuits, and the pixel driving circuits may be connected to a control circuit, so as to respectively drive the light-emitting devices 13 to emit light according to electrical signals input from the control circuit. The pixel driving circuit may be an active driving circuit or a passive driving circuit.

The light-emitting substrate 1 may emit white light, monochromatic light (i.e., light of a single color), or color-adjustable light.

In a first example, the light-emitting substrate 1 may emit white light. At this point, in a first case, the plurality of light-emitting devices 13 (e.g., all of the light-emitting devices 13) included in the light-emitting substrate 1 each emit white light. In this case, a material of the light-emitting pattern 133a in each light-emitting device 13 may include a mixed material of a red quantum dot light-emitting material, a green quantum dot light-emitting material and a blue quantum dot light-emitting material. In this case, each light-emitting device 13 may be driven to emit light, so as to emit white light. In a second case, as shown in FIGS. 1 and 2, the plurality of light-emitting devices 13 include light-emitting device(s) 13R that emit red light, light-emitting device(s) 13G that emit green light and light-emitting device(s) 13B' that emit blue light. A material of a light-emitting pattern 133a in the light-emitting device 13R may include a red quantum dot (RQD) light-emitting material, a material of a light-emitting pattern 133a in the light-emitting device 13G may include a green quantum dot (GQD) light-emitting material, and a material of a light-emitting pattern 133a in the light-emitting device 13B' may include a blue quantum dot (BQD) light-emitting material. In this case, by controlling light-emitting brightnesses of the light-emitting device 13R, the light-emitting device 13G and the light-emitting device 13B', the light-emitting device 13R, the light-emitting device 13G and the light-emitting device 13B' may emit mixed light, so that the light-emitting substrate 1 can emit white light.

In this example, the light-emitting substrate 1 may be used for lighting, i.e., may be applied to a lighting apparatus.

In a second example, the light-emitting substrate 1 may emit the monochromatic light. In a first case, the plurality of light-emitting devices 13 (e.g., all of the light-emitting devices 13) included in the light-emitting substrate 1 each emit monochromatic light (e.g., red light), and in this case, a material of the light-emitting pattern 133a in each light-emitting device 13 includes a red quantum dot light-emitting material. In this case, each light-emitting device 13 may be driven to emit light, so as to emit red light. In a second case, the light-emitting substrate 1 has similar structures as the plurality of light-emitting devices in the second case of the first example. In this case, the light-emitting device 13R, the light-emitting device 13G or the light-emitting device 13B' may be driven individually to emit the monochromatic light.

In this example, the light-emitting substrate 1 may be used for lighting, i.e., may be applied to a lighting apparatus, or may be used for displaying an image or picture of a single color, i.e., may be applied to a display apparatus.

In a third example, the light-emitting substrate 1 may emit the color-adjustable light (i.e., colored light), and the light-emitting substrate 1 has similar structures as the plurality of light-emitting devices in the second case of the first example. By controlling brightnesses of the light-emitting devices 13, a color and a brightness of the mixed light emitted from the light-emitting substrate 1 may be controlled to emit the colored light.

In this example, the light-emitting substrate may be used for displaying an image or picture, i.e., may be applied to a display apparatus. Of course, the light-emitting substrate maybe applied to a lighting apparatus.

Figure 3:
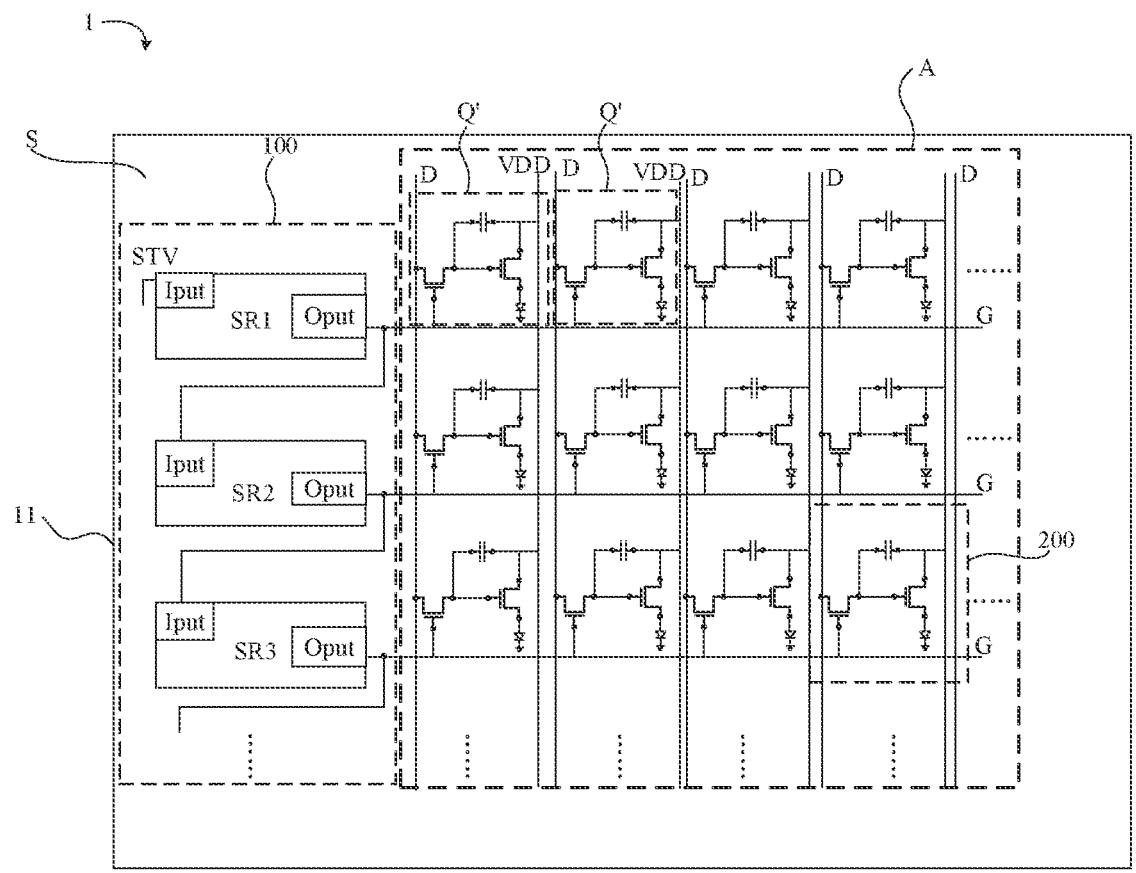
FIG. 3 is a top view of a light-emitting substrate, in accordance with some embodiments.

In the third example, in an example where the light-emitting substrate 1 is the display substrate, such as a full-color display panel, as shown in FIG. 3, the light-emitting substrate 1 has a display area A and a peripheral area S disposed on a periphery of the display area A. The display area A includes a plurality of sub-pixel regions Q', each sub-pixel region Q' corresponds to an opening Q, and an opening Q corresponds to a light-emitting device. Each sub-pixel region Q' is provided with the pixel driving circuit 200 therein for driving a corresponding light-emitting device to emit light. The peripheral area S is used for wiring, e.g., for providing gate driving circuit(s) 100 connected to the pixel driving circuits 200.

In some embodiments, the pixel driving circuit 200 may include thin film transistors and capacitor(s). For example, the pixel driving circuit 200 may be of a 2T1C structure.

Figure 4:
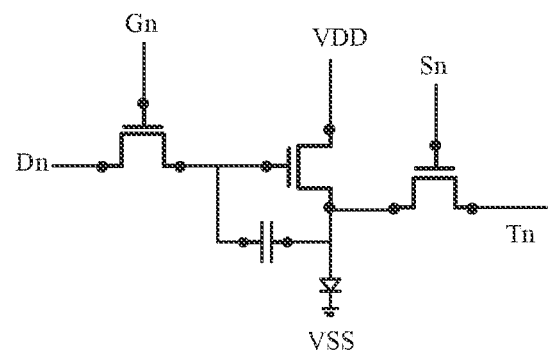
FIG. 4 is an equivalent circuit diagram of a pixel driving circuit of a 3T1C structure, in accordance with some embodiments.

Of course, in some embodiments, the pixel driving circuit 200 may be of a 7T1C or 3T1C structure. As shown in FIG. 4, a specific example of the pixel driving circuit 200 of the 3T1C structure is illustrated.

In addition, it will be noted that in order to realize white balance of the full-color display panel, for sub-pixel regions with different light-emitting colors, an area of a sub-pixel region Q' that can emit red light and an area of a sub-pixel region Q' that can emit green light are each greater than an area of a sub-pixel region Q' that can emit blue light. Furthermore, the area of the sub-pixel region Q' that can emit red light may be equal to the area of the sub-pixel region Q' that can emit green light, or may be greater than or less than the area of the sub-pixel region Q' that can emit green light.

In some embodiments, as shown in FIG. 2, in addition to the display substrate, the display apparatus (i.e., the light-emitting apparatus 2) may further include an encapsulation layer 14 and a light control layer 15 disposed on the display substrate. The encapsulation (thin film encapsulation (TFE)) layer 14 is used for protecting the light-emitting devices 13. The light control layer 15 may control reflected light from the display substrate through external light. For example, the light control layer 15 may include a polarizer 151 and/or a color filter layer 152 (e.g., a color film (CF) layer) that includes patterns CF-B each corresponding to blue quantum dots (BQD), patterns CF-G each corresponding to green quantum dots (GQD), patterns CF-R each corresponding to red quantum dots (RQD) and black matrixes (BM).

When quantum dot light-emitting diodes (QLED) using quantum dots as light-emitting materials are widely used in the display field, a manufacturing technology of the light-emitting functional layer mainly includes an inkjet printing technology, a photolithography technology and a transfer printing technology, and the photolithography technology is the most promising method for manufacturing high-resolution QLEDs.

The photolithography technology is a technology of patterning a film of a quantum dot light-emitting material by using exposure and development methods. Here, there are two possible cases. In a first case, the film of the quantum dot light-emitting material is patterned by using a direct photolithography method. The quantum dot light-emitting material may include photosensitive ligands, and is directly exposed and developed to change a solubility of the quantum dot light-emitting material, thereby patterning the film of the quantum dot light-emitting material. In a second case, the film of the quantum dot light-emitting material is patterned by using a sacrificial layer. Before the film of the quantum dot light-emitting material is formed, the sacrificial layer is firstly formed in regions in each of which the quantum dot light-emitting material needs to be removed, and the film of the quantum dot light-emitting material is patterned by eluting the sacrificial layer.

The above patterning methods each are convenient for controlling a respective process flow, and are capable of effectively realizing production of high-resolution QLED products. However, for the first case, the patterning method has a problem of incomplete elution of a quantum dot light-emitting material (e.g., red quantum dot (RQD) light-emitting material) in a previous layer, so that after a patterning process of a next color of quantum dot light-emitting material (e.g., green quantum dot (GQD) light-emitting material), a residue of the quantum dot light-emitting material in the previous layer exists, thereby causing a problem of color mixing. Therefore, a problem of impure luminescent spectra easily occurs during lighting, thereby affecting device performances. For the second case, although the patterning method may avoid the residue of the quantum dot light-emitting material, the quantum dot light-emitting material is continuously eluted in the elution process, which results in a loss of the quantum dot light-emitting material, which is not conducive to improving a utilization rate of the quantum dot light-emitting material.

Figure 5A:
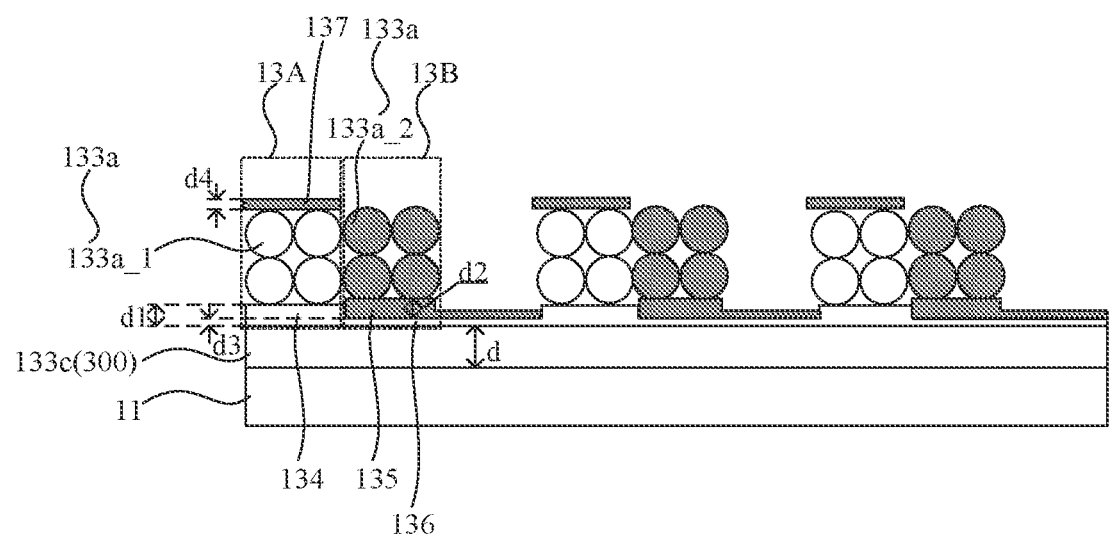
FIG. 5A is a sectional view of yet another light-emitting substrate, in accordance with some embodiments.

In some embodiments of the present disclosure, as shown in FIG. 5A, the plurality of light-emitting devices include at least one first light-emitting device 13A. The first light-emitting device 13A may be, for example, a light-emitting device that can emit red light. The at least one first light-emitting device 13A further includes a first material layer 134. The first material layer 134 is disposed on a side, proximate to the substrate 11, of a light-emitting pattern 133a (also referred to as a first light-emitting pattern 133a_1 here) included in the at least one first light-emitting device 13A, and is in contact with the light-emitting pattern 133a included in the at least one first light-emitting device 13A. A material of light-emitting pattern(s) 133a included in the at least one first light-emitting device 13A includes a first light-emitting material, and a material of first material layer(s) 134 includes a first material. The first material is capable of generating a second material under light irradiation of a first wavelength band, and a solubility of the first material and a solubility of the first light-emitting material are each different from a solubility of the second material in a same solvent. Alternatively, the first material is generated by a third material under light irradiation of a second wavelength band, and a solubility of the first material and a solubility of the first light-emitting material are each different from a solubility of the third material in a same solvent.

According to the fact that the first light-emitting device 13A may be the light-emitting device that can emit red light, the first light-emitting material may be a red quantum dot light-emitting material.

According to the fact that the material of the first material layer(s) 134 includes the first material, and the first material is capable of generating the second material under the light irradiation of the first wavelength band, or the first material is generated by the third material under the light irradiation of the second wavelength band, it can be known that the first material may be used as a positive photoresist, and the third material may be used as a negative photoresist.

In a case where the first material is used as the positive photoresist, the first material is soluble in a developer after exposure. In this case, the second material is soluble in the developer, and the first material is insoluble in the developer. However, in a case where the third material is used as the negative photoresist, the third material is insoluble in a developer after exposure. In this case, the first material is insoluble in the developer, and the third material is soluble in the developer.

The above two methods are capable of patterning the first light-emitting material.

Figure 5B:
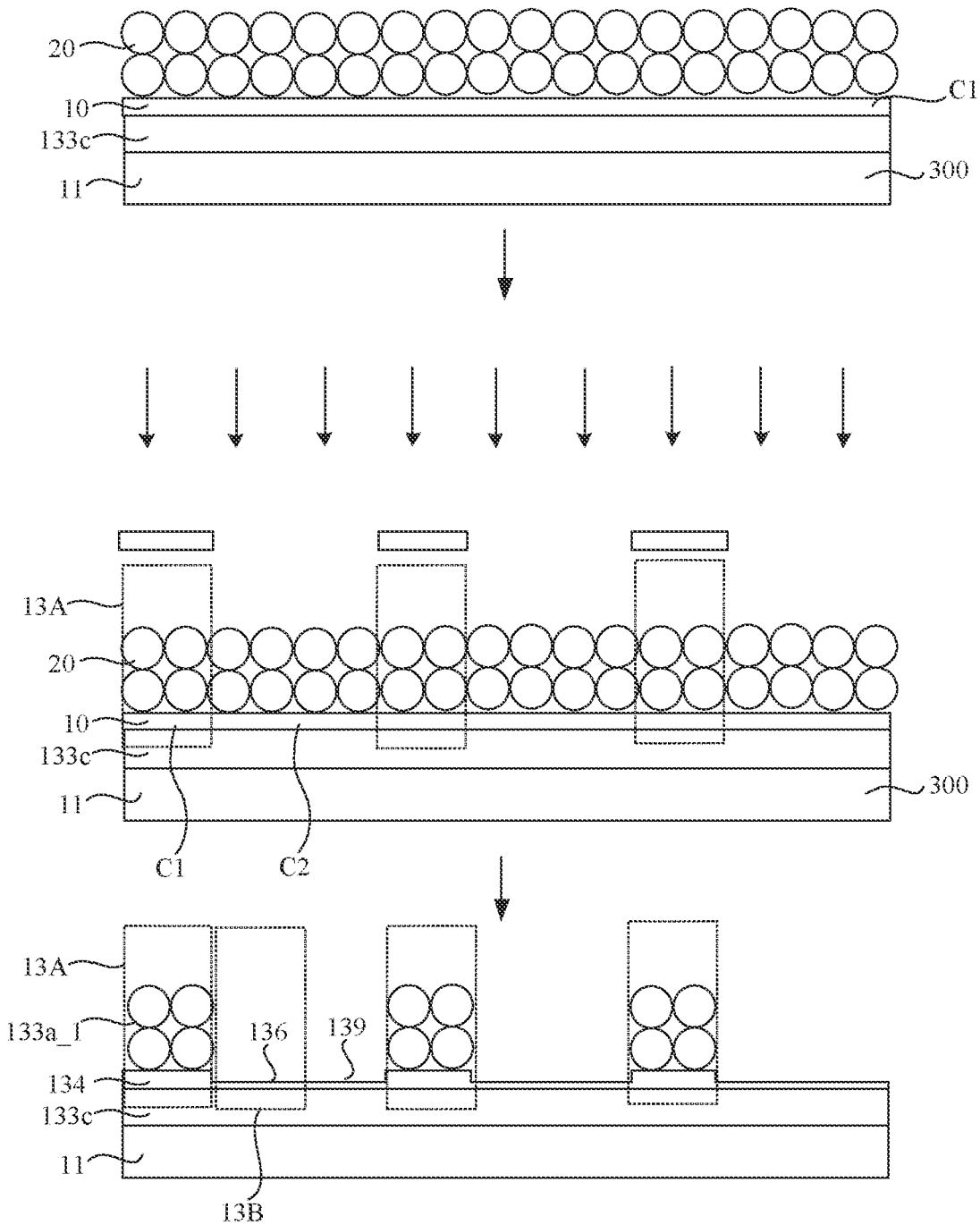
FIG. 5B is a flow diagram of a method of manufacturing first light-emitting pattern(s), in accordance with some embodiments.

In some embodiments, in an example where the first material is used as the positive photoresist, and in a case where the first light-emitting pattern(s) 133a_1 included in the at least one first light-emitting device 13A are manufactured by a patterning process, as shown in FIG. 5B, a first film 10 may be formed on the substrate 11 firstly, and the first film 10 may include the first material C1. Then, a second film 20 is formed on the first film 10, and the second film 20 may be made of the red quantum dot light-emitting material. Next, a portion of the first film 10 and a portion of the second film 20 that are located in a region where the plurality of light-emitting devices 13 except the first light-emitting device(s) 13A are located, are irradiated with light of the first wavelength band, so as to change a solubility of the portion of the first film 10 located in the region where the plurality of light-emitting devices 13 except the first light-emitting device(s) 13A are located. That is, in this case, a material of the portion of the first film 10 located in the region where the plurality of light-emitting devices 13 except the first light-emitting device(s) 13A are located is changed from the first material C1 to the second material C2. According to the fact that the second material C2 is soluble in the developer, and the first material C1 is insoluble in the developer, the second material C2 may be removed by the developer. That is, the portion of the first film 10 located in the remaining region of the plurality of light-emitting devices 13 except a region where the first light-emitting device(s) 13A are located is removed, and the portion of the second film 20 located in the remaining region of the plurality of light-emitting devices 13 except the region where the first light-emitting device(s) 13A are located is also removed, so that a portion of the first film 10 and a portion of the second film 20 that are located in the region where the first light-emitting device(s) 13A are located are retained. Thus, the first material layer(s) 134 and the first light-emitting pattern(s) 133a_1 included in the at least one first light-emitting device 13A may be obtained.

Figure 5C:
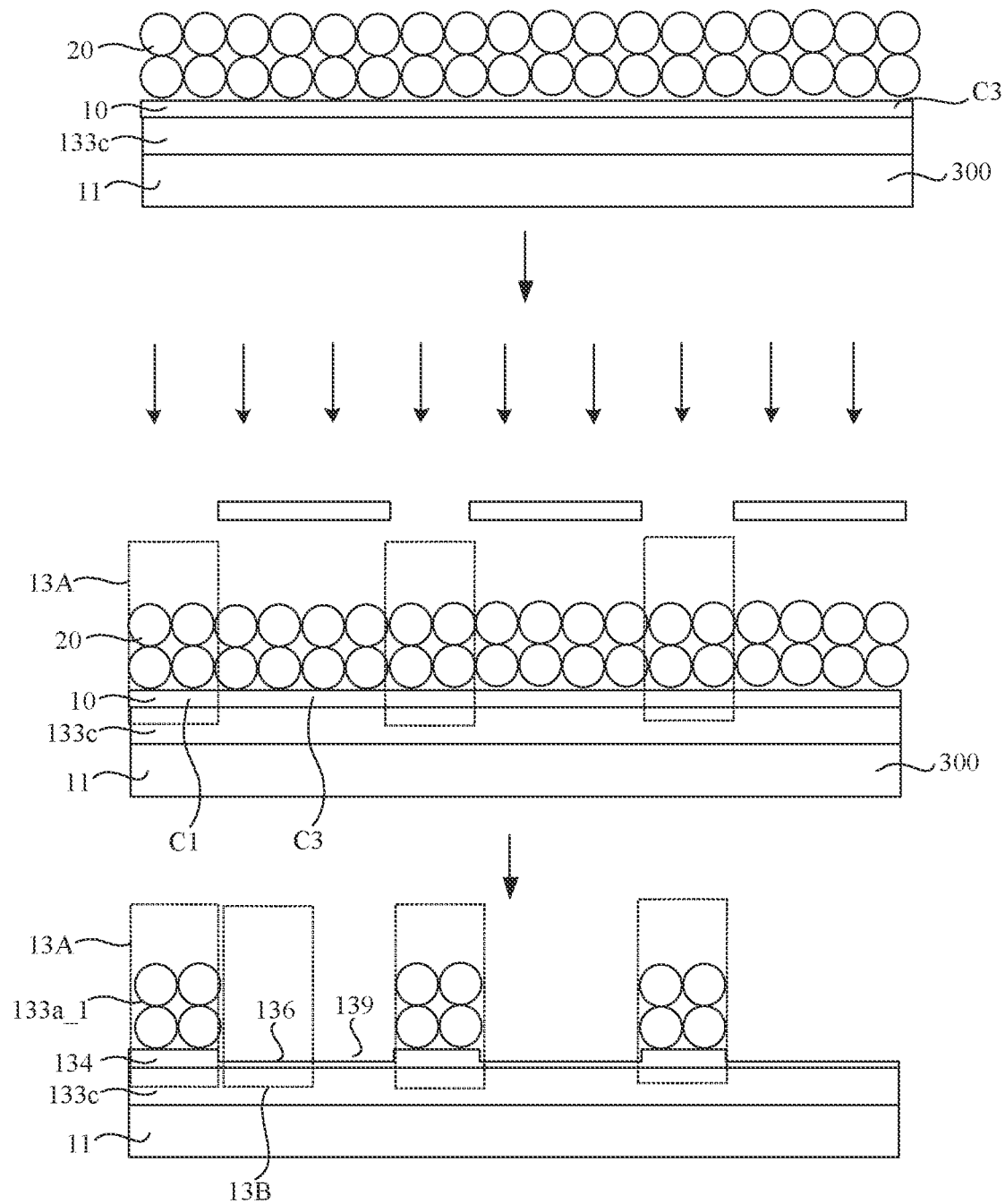
FIG. 5C is a flow diagram of another method of manufacturing first light-emitting pattern(s), in accordance with some embodiments.

In some other embodiments, in an example where the third material is used as the negative photoresist, and in a case where the first light-emitting pattern(s) 133a_1 included in the at least one first light-emitting device 13A are manufactured by a patterning process, as shown in FIG. 5C, a first film 10 may be formed on the substrate 11 firstly, and the first film 10 may include the third material C3. Then, a second film 20 is formed on the first film 10, and the second film 20 may be made of the red quantum dot light-emitting material. Next, a portion of the first film 10 and a portion of the second film 20 that are located in the region where the first light-emitting device(s) 13A are located, are irradiated with light of the second wavelength band, so as to change a solubility of the portion of the first film 10 located in the region where the first light-emitting device(s) 13A are located. That is, in this case, a material of the portion of the first film 10 located in the region where the first light-emitting device(s) 13A are located is changed from the third material C3 to the first material C1, and a material of a portion of the first film 10 located in the region where the plurality of light-emitting devices 13 except the first light-emitting device(s) 13A are located is unchanged, and is still the third material C3. The first material C1 is insoluble in the developer, and the third material C3 is soluble in the developer. By using the developer, the portion of the first film 10 located in the remaining region of the plurality of light-emitting devices 13 except the region where the first light-emitting device(s) 13A are located is removed, and a portion of the second film 20 located in the remaining region of the plurality of light-emitting devices 13 except the region where the first light-emitting device(s) 13A are located is also removed, so that the portion of the first film 10 and the portion of the second film 20 that are located in the region where the first light-emitting device(s) 13A are located are retained. Thus, the first material layer(s) 134 and the first light-emitting pattern(s) 133a_1 included in the at least one first light-emitting device 13A may be obtained.

Compared with the fact that the quantum dot light-emitting material is patterned by using the direct photolithography method, by adding the first material C1 or the third material C3 as a photoresist layer, the first material C1 or the third material C3 is exposed and developed by using a difference in solubility of the first material C1 or the third material C3 before and after light irradiation, so that the portion of the red quantum dot light-emitting material located in the remaining region except the region where the first light-emitting device(s) 13A are located may be removed by using the second material C2 or the third material C3 as a sacrificial layer. Thus, formation of a residue of the red quantum dot light-emitting material in the remaining region except the region where the first light-emitting device(s) 13A are located may be avoided, thereby solving the problem of color mixing caused by the residue of the quantum dot light-emitting material in the previous layer after the patterning process of the next color of quantum dot light-emitting material in the related art. Compared with the fact that the quantum dot light-emitting material is patterned by using the sacrificial layer in the related art, by selecting the materials, the solubility of the first light-emitting material is different from the solubility of the second material C2 as the sacrificial layer in the same solvent or the solubility of the third material C3 as the sacrificial layer in the same solvent, so that the first light-emitting material may be prevented from being removed in a subsequent development process, thereby solving the problem of the loss of the quantum dot light-emitting material in the related art.

In some embodiments, the first material C1 and the first light-emitting material each include metal nanoparticles and ligands bound to the metal nanoparticles. The ligands included in the first material C1 are the same as or different from the ligands included in the first light-emitting material. Moreover, in a case where the ligands included in the first material C1 are the same as the ligands included in the first light-emitting material, ligands included in the third material C3 are photosensitive ligands. In a case where the ligands included in the first material C1 are different from the ligands included in the first light-emitting material, the ligands included in the first light-emitting material are non-photosensitive ligands, and a solubility of the non-photosensitive ligands is different from the solubility of the second material C2 in the same solvent, or the solubility of the non-photosensitive ligands is different from the solubility of the third material C3 in the same solvent.

In these embodiments, the ligands included in the first material C1 may be photosensitive ligands or non-photosensitive ligands, depending on whether the first material C1 generates the second material under the light irradiation of the first wavelength band or the first material C1 is generated by the third material C3 under the light irradiation of the second wavelength band. In a case where the first material C1 generates the second material under the light irradiation of the first wavelength band, the ligands included in the first material C1 are the photosensitive ligands. In this case, there are two possible cases, depending on whether the ligands included in the first material C1 are the same as or different from the ligands included in the first light-emitting material. In a first case, the ligands included in the first material C1 are the same as the ligands included in the first light-emitting material, and in this case, the ligands included in the first light-emitting material are also photosensitive ligands. In a second case, the ligands included in the first material are different from the ligands included in the first light-emitting material, and in this case, the ligands included in the first light-emitting material may be photosensitive ligands or non-photosensitive ligands, as long as the solubility of the first light-emitting material is different from the solubility of the second material C2 in the same solvent.

In a case where the first material C1 is generated by the third material C3 under the light irradiation of the second wavelength band, the ligands included in the third material C3 are the photosensitive ligands. In this case, the ligands included in the first material C1 may be the non-photosensitive ligands, and the ligands included in the first light-emitting material may also be the non-photosensitive ligands. In this case, the non-photosensitive ligands included in the first light-emitting material may be the same as or different from the non-photosensitive ligands included in the first material C1, and the solubility of the non-photosensitive ligands included in the first light-emitting material and a solubility of the non-photosensitive ligands included in the first material C1 are each different from the solubility of the third material C3 in the same solvent.

In these embodiments, in a case where the ligands included in the first material C1 are the same as the ligands included in the first light-emitting material, in any one of the above cases, in the subsequent development process, the first material C1 and the first light-emitting material may be removed or retained as a whole due to the same ligands, so that the first light-emitting material is able to be completely removed to improve the patterning effect of the first light-emitting material, compared with the case that the ligands included in the first material C1 are different from the ligands included in the first light-emitting material such that the solubility of the first material C1 is different from the solubility of the first light-emitting material.

In some embodiments, the photosensitive ligands include ligands capable of undergoing a decomposition reaction or a crosslinking reaction under light irradiation.

For example, in some embodiments, the photosensitive ligand may be a compound containing unsaturated group(s) or epoxy group(s), and the unsaturated group(s) or epoxy group(s) undergo a crosslinking reaction after light irradiation to change the solubility. Alternatively, the photosensitive ligand may have amide bond(s) or ester bond(s), and the amide bond(s) or the ester bond(s) are deacylated after light irradiation to change the solubility.

In some embodiments, the photosensitive ligand includes any one of 2-(Boc-amino)ethanethiol (Boc) and Mono-2-(Methacryloyloxy)ethyl succinate (MMES).

In a case where the photosensitive ligand includes 2-(Boc-amino)ethanethiol, during application, in a presence of a photoacid generator (e.g., 2,4-Bis(trichloromethyl)-6-(4-methoxystyryl)-1,3,5-triazine, PAG), 2-(Boc-amino)ethanethiol may be changed into 2-Aminoethanethiol by removing a Boc group under ultraviolet (UV) irradiation, thereby changing the solubility. A specific reaction equation is as shown in a following formula. In a case where the photosensitive ligand includes MMES (such ligand has following characteristics: an end has groups for light crosslinking such as double bond(s), triple bond(s), acrylate bond(s) and ethylene oxide group(s), and another end has coordination groups such as mercapto, carboxyl and amino), during application, Diphenyl(2,4,6-trimethylbenzoyl)phosphine oxide (TPO) serves as a photoinitiator, and double bonds at tail ends of the MMES ligands are initiated to be crosslinked by using free radicals generated by the TPO under light irradiation, thereby changing the solubility.

The reaction equation of 2-(Boc-amino)ethanethiol under light irradiation is as follows:

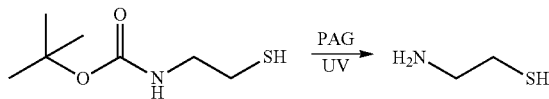

In some embodiments, the metal nanoparticles included in the first material C1 include zinc oxide, titanium oxide or nickel oxide nanoparticles, and the metal nanoparticles included in the first light-emitting material include quantum dots.

In a case where the metal nanoparticles included in the first material C1 include zinc oxide or titanium oxide nanoparticles, the first material may have an electron transport function, and in this case, the first material layer 134 may serve as an electron transport layer 133c. In a case where the metal nanoparticles included in the first material include nickel oxide nanoparticles, the first material C1 may have a hole transport function, and in this case, the first material layer 134 may serve as a hole transport layer.

The quantum dots may be semiconductor nanocrystals, and may have various shapes. For example, the quantum dot is a nanoparticle with at least one of a spherical shape, a conical shape, a multi-arm shape and a cubic shape, a nanotube, a nanowire, a nanofiber, a nanoplate particle, a quantum rod, or a quantum sheet. Here, the quantum rod may be a quantum dot with an aspect ratio (i.e., a ratio of length to diameter or a ratio of length to width) of greater than about 1, such as greater than or equal to about 2, greater than or equal to about 3, or greater than or equal to about 5. For example, the quantum rod may have an aspect ratio of less than or equal to about 50, less than or equal to about 30, or less than or equal to about 20.

The quantum dots may have a particle diameter (i.e., an average maximum particle length for quantum dots with a non-spherical shape) in a range of, for example, about 1 nm to about 100 nm, about 1 nm to about 80 nm, about 1 nm to about 50 nm, or about 1 nm to 20 nm.

An energy band gap of the quantum dot may be controlled according to the size and the composition of the quantum dot, and thus a light-emitting wavelength of the quantum dot may be controlled. For example, when the size of the quantum dot is increased, the quantum dot may have a narrow energy band gap, and thus be configured to emit light in a long wavelength range, and when the size of the quantum dot is decreased, the quantum dot may have a wide energy band gap, and thus be configured to emit light in a short wavelength range. For example, the quantum dot may be configured to emit light in a predetermined wavelength range of a visible light range according to its size and/or composition. For example, the quantum dot may be configured to emit blue light, red light, or green light. Moreover, blue light may have a peak emission wavelength (i.e., wavelength $\lambda$ corresponding to a peak absorption value) in a range of, for example, about 430 nm to about 480 nm, red light may have a peak emission wavelength (i.e., wavelength $\lambda$ corresponding to a peak absorption value) in a range of, for example, about 600 nm to about 650 nm, and green light may have a peak emission wavelength (i.e., wavelength $\lambda$ corresponding to a peak absorption value) in a range of, for example, about 520 nm to about 560 nm.

For example, an average particle size of a quantum dot configured to emit blue light may be in a range of, for example, less than or equal to about 4.5 nm, less than or equal to about 4.3 nm, less than or equal to about 4.2 nm, less than or equal to about 4.1 nm, or less than or equal to about 4.0 nm. For example, the average particle size of the quantum dot may be in a range of about 2.0 nm to about 4.5 nm, such as in a range of about 2.0 nm to about 4.3 nm, about 2.0 nm to about 4.2 nm, about 2.0 nm to about 4.1 nm, or about 2.0 nm to about 4.0 nm.

The quantum dot may have a quantum yield of, for example, greater than or equal to about 10%, greater than or equal to about 20%, greater than or equal to about 30%, greater than or equal to about 50%, greater than or equal to about 60%, greater than or equal to about 70%, or greater than or equal to about 90%.

The quantum dot may have a narrow full width at half maximum (FWHM). Here, the FWHM is a peak width corresponding to half of a peak absorption value. Moreover, when the FWHM is narrow, the quantum dot may be configured to emit light in a narrow wavelength range, and a high color purity may be obtained. The quantum dot may have a FWHM of, for example, less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm. In the above range, the quantum dot may have a FWHM in a range of, for example, about 2 nm to about 49 nm, about 2 nm to about 48 nm, about 2 nm to about 47 nm, about 2 nm to about 46 nm, about 2 nm to about 45 nm, about 2 nm to about 44 nm, about 2 nm to about 43 nm, about 2 nm to about 42 nm, about 2 nm to about 41 nm, about 2 nm to about 40 nm, about 2 nm to about 39 nm, about 2 nm to about 38 nm, about 2 nm to about 37 nm, about 2 nm to about 36 nm, about 2 nm to about 35 nm, about 2 nm to about 34 nm, about 2 nm to about 33 nm, about 2 nm to about 32 nm, about 2 nm to about 31 nm, about 2 nm to about 30 nm, about 2 nm to about 29 nm, or about 2 nm to about 28 nm.

For example, the quantum dot may include group II-VI semiconductor compound(s), group III-V semiconductor compound(s), group IV-VI semiconductor compound(s), group IV semiconductor(s), group I-III-VI semiconductor compound(s), group I-II-IV-VI semiconductor compound(s), group II-III-V semiconductor compound(s), or any combination thereof. For example, the group II-VI semiconductor compound may be selected from: binary compounds such as CdSe, CdTe, ZnS, ZnSe, ZnTe, ZnO, HgS, HgSe, HgTe, MgSe, MgS, or mixtures thereof; ternary compounds such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or mixtures thereof; and quaternary compounds such as HgZnTeS, CdZnSeS, CdZnSeTe, CdZnSTe, CdHgSeS, CdHgSeTe, CdHgSTe, HgZnSeS, HgZnSeTe, HgZnSTe, or mixtures thereof, but is not limited thereto. For example, the group III-V semiconductor compound may be selected from: binary compounds such as GaN, GaP, GaAs, GaSb, AlN, AlP, AlAs, AlSb, InN, InP, InAs, InSb, or mixtures thereof; ternary compounds such as GaNP, GaNAs, GaNSb, GaPAs, GaPSb, AlNP, AlNAs, AlNSb, AlPAs, AlPSb, InNP, InNAs, InNSb, InPAs, InPSb, or mixtures thereof; and quaternary compounds such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or mixtures thereof, but is not limited to thereto. For example, the group IV-VI semiconductor compound may be selected from: binary compounds such as SnS, SnSe, SnTe, PbS, PbSe, PbTe, or mixtures thereof; ternary compounds such as SnSeS, SnSeTe, SnSTe, PbSeS, PbSeTe, PbSTe, SnPbS, SnPbSe, SnPbTe, or mixtures thereof; and quaternary compounds such as SnPbSSe, SnPbSeTe, SnPbSTe, or mixtures thereof, but is not limited to thereto. For example, the group IV semiconductor may be selected from: elemental (mono) semiconductors such as Si, Ge, or mixtures thereof; and binary semiconductor compounds such as SiC, SiGe, or mixtures thereof, but is not limited thereto. The group I-III-VI semiconductor compound may be, for example, $CuInSe_2$, $CuInS_2$, CuInGaSe, CuInGaS, or a mixture thereof, but is not limited thereto. The group I-II-IV-VI semiconductor compound may be, for example, CuZnSnSe, CuZnSnS, or a mixture thereof, but is not limited thereto. The group II-III-V semiconductor compound may include, for example, InZnP, but is not limited thereto.

The quantum dots may be distributed at a substantially uniform concentration or at locally different concentrations. The quantum dot includes elemental semiconductor(s), binary semiconductor compound(s), ternary semiconductor compound(s), or quaternary semiconductor compound(s).

For example, the quantum dots may include cadmium (Cd)-free quantum dots. The cadmium-free quantum dot is a quantum dot that does not include cadmium. Cadmium (Cd) may cause serious environmental/health problems, and is a restricted element under the Restriction of Hazardous Substances (RoHS) in many countries, and thus non-cadmium-based quantum dots may be effectively used.

As an example, the quantum dot may be made of semiconductor compound(s) including at least one of zinc (Zn), tellurium (Te) and selenium (Se). For example, the quantum dot may be made of at least one of a Zn-Te semiconductor compound, a Zn-Se semiconductor compound and a Zn-Te-Se semiconductor compound. For example, a content of Te may be less than a content of Se in the Zn-Te-Se semiconductor compound.

The semiconductor compound may have a peak emission wavelength (i.e., wavelength A corresponding to a peak absorption value) in a wavelength range of less than or equal to about 480 nm, for example, about 430 nm to about 480 nm, and may be configured to emit blue light.

For example, the quantum dot may be made of semiconductor compound(s) including at least one of indium (In), zinc (Zn) and phosphorus (P). For example, the quantum dot may be made of an In-P semiconductor compound and/or an In-Zn-P semiconductor compound. For example, in the In-Zn-P semiconductor compound, a molar ratio of zinc (Zn) to indium (In) may be greater than or equal to about 25. The semiconductor compound may have a peak emission wavelength (i.e., wavelength A corresponding to a peak absorption value) in a wavelength range of less than about 700 nm, for example, about 600 nm to about 650 nm, and may be configured to emit red light.

The quantum dot may have a core-shell structure. For example, a core and a shell of the quantum dot may have an interface. At least one element of the core or shell in the interface may have a concentration gradient, and a concentration of the element of the shell decreases toward the core. For example, the material composition of the shell of the quantum dot has a higher energy band gap than the material composition of the core of the quantum dot, and thus the quantum dot may exhibit a quantum confinement effect.

The quantum dot may have a core and a plurality of layers of shells around the core. Here, the plurality of layers of shells have at least two shells. The shells may be made of a single composition or an alloy, and/or the shells may have a concentration gradient.

For example, in the plurality of shells, a shell away from the core may have a higher energy band gap than a shell proximate to the core, and thus the quantum dot may exhibit the quantum confinement effect.

For example, the quantum dot with the core-shell structure may include: a core including a first semiconductor compound, the first semiconductor compound including at least one of zinc (Zn), tellurium (Te) and selenium (Se); and a shell disposed on at least a portion of the core and including a second semiconductor compound with a composition different from that of the core.

For example, the first semiconductor compound may be a Zn-Te-Se based semiconductor compound including zinc (Zn), tellurium (Te) and selenium (Se), e.g., a Zn-Se based semiconductor compound including a small amount of tellurium (Te). For example, the first semiconductor compound may be a semiconductor compound represented by $ZnTe_xSe_{1-x}$, in which x is greater than about 0 and less than or equal to 0.05.

For example, in the first semiconductor compound based on Zn-Te-Se, a molar weight of zinc (Zn) may be higher than a molar weight of selenium (Se), and the molar weight of selenium (Se) may be higher than a molar weight of tellurium (Te). For example, in the first semiconductor compound, a molar ratio of tellurium (Te) to selenium (Se) may be less than or equal to about 0.05, less than or equal to about 0.049, less than or equal to about 0.048, less than or equal to about 0.047, less than or equal to about 0.045, less than or equal to about 0.044, less than or equal to about 0.043, less than or equal to about 0.042, less than or equal to about 0.041, less than or equal to about 0.04, less than or equal to about 0.039, less than or equal to about 0.035, less than or equal to about 0.03, less than or equal to about 0.029, less than or equal to about 0.025, less than or equal to about 0.024, less than or equal to about 0.023, less than or equal to about 0.022, less than or equal to about 0.021, less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.01. For example, in the first semiconductor compound, a molar ratio of tellurium (Te) to zinc (Zn) may be less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.010.

The second semiconductor compound may include, for example, group II-VI semiconductor compound(s), group III-V semiconductor compound(s), group IV-VI semiconductor compound(s), group IV semiconductor(s), group I-III-VI semiconductor compound(s), group I-II-IV-VI semiconductor compound(s), group II-III-V semiconductor compound(s), or any combination thereof. Examples of the group II-VI semiconductor compound, the group III-V semiconductor compound, the group IV-VI semiconductor compound, the group IV semiconductor, the group I-III-VI semiconductor compound, the group I-II-IV-VI semiconductor compound and the group II-III-V semiconductor compound are the same as those described above.

For example, the second semiconductor compound may include at least one of zinc (Zn), selenium (Se) and sulfur (S). For example, the shell may include ZnSeS, ZnSe, ZnS, or any combination thereof. For example, the shell may include at least one inner shell disposed adjacent to the core and an outermost shell disposed on an outermost side of the quantum dot. The inner shell may include ZnSeS, ZnSe, or a combination thereof, and the outermost shell may include ZnS. For example, the shell may have a concentration gradient of a component. For example, a content of sulfur (S) may increase in a direction away from the core.

For example, the quantum dot with the core-shell structure may include: a core including a third semiconductor compound, the third semiconductor compound including at least one of indium (In), zinc (Zn) and phosphorus (P); and a shell disposed on at least a portion of the core and including a fourth semiconductor compound with a composition different from that of the core.

In the third semiconductor compound based on In-Zn-P, a molar ratio of zinc (Zn) to indium (In) may be greater than or equal to about 25. For example, in the third semiconductor compound based on In-Zn-P, the molar ratio of zinc (Zn) to indium (In) may be greater than or equal to about 28, greater than or equal to about 29, or greater than or equal to about 30. For example, in the third semiconductor compound based on In-Zn-P, the molar ratio of zinc (Zn) to indium (In) may be less than or equal to about 55, e.g., less than or equal to about 50, less than or equal to about 45, less than or equal to about 40, less than or equal to about 35, less than or equal to about 34, less than or equal to about 33, or less than or equal to about 32.

The fourth semiconductor compound may include, for example, group II-VI semiconductor compound(s), group III-V semiconductor compound(s), group IV-VI semiconductor compound(s), group IV semiconductor(s), group I-III-VI semiconductor compound(s), group I-II-IV-VI semiconductor compound(s), group II-III-V semiconductor compound(s), or any combination thereof. Examples of the group II-VI semiconductor compound, the group III-V semiconductor compound, the group IV-VI semiconductor compound, the group IV semiconductor, the group I-III-VI semiconductor compound, the group I-II-IV-VI semiconductor compound and the group II-III-V semiconductor compound are the same as those described above.

For example, the fourth semiconductor compound may include zinc (Zn) and at least one of selenium (Se) and sulfur (S). For example, the shell may include ZnSeS, ZnSe, ZnS, or any combination thereof. For example, the shell may include at least one inner shell disposed adjacent to the core and an outermost shell disposed on an outermost side of the quantum dot. At least one of the inner shell(s) and the outermost shell may include the fourth semiconductor compound ZnS, ZnSe, or ZnSeS.

The light-emitting pattern may have a thickness in a range of, for example, about 5 nm to about 200 nm, in this range, such as about 10 nm to about 150 nm, such as about 10 nm to about 100 nm, such as about 10 nm to about 50 nm. Quantum dots QD included in the light-emitting pattern may be laminated into one or more than one layer, e.g., two layers. However, embodiments of the inventive concept are not limited thereto, and the quantum dots QD may be laminated into one to ten layers. The quantum dots QD may be laminated into any suitable number of layers, depending on the type (or types) of the quantum dots QD that are used and a desired emission wavelength of light.

The quantum dot may have a deep HOMO (highest occupied molecular orbital) energy level. For example, the quantum dot may have an absolute value of the HOMO energy level that is in a range of greater than or equal to about 5.4 eV, in this range, such as greater than or equal to about 5.5 eV, such as greater than or equal to about 5.6 eV, such as greater than or equal to about 5.7 eV, such as greater than or equal to about 5.8 eV, such as greater than or equal to about 5.9 eV, such as greater than or equal to about 6.0 eV. In the above range, an absolute value of an HOMO energy level of a quantum dot layer may be in a range of, for example, about 5.4 eV to about 7.0 eV, such as about 5.4 eV to about 6.8 eV, such as about 5.4 eV to about 6.7 eV, such as about 5.4 eV to about 6.5 eV, such as about 5.4 eV to about 6.3 eV, such as about 5.4 eV to about 6.2 eV, such as about 5.4 eV to about 6.1 eV; in the above range, such as about 5.5 eV to about 7.0 eV, such as about 5.5 eV to about 6.8 eV, such as about 5.5 eV to about 6.7 eV, such as about 5.5 eV to about 6.5 eV, such as about 5.5 eV to about 6.3 eV, such as about 5.5 eV to about 6.2 eV, such as about 5.5 eV to about 6.1 eV, such as about 5.6 eV to about 6.8 eV, such as about 5.6 eV to about 6.7 eV, such as about 5.6 eV to about 6.5 eV, such as about 5.6 eV to about 6.3 eV, such as about 5.6 eV to about 6.2 eV, such as about 5.6 eV to about 6.1 eV; in the above range, such as about 5.7 eV to about 7.0 eV, such as about 5.7 eV to about 6.8 eV, such as about 5.7 eV to about 6.7 eV, such as about 5.7 eV to about 6.5 eV, such as about 5.7 eV to about 6.3 eV, such as about 5.7 eV to about 6.2 eV, such as about 5.7 eV to about 6.1 eV; in the above range, such as about 5.8 eV to about 7.0 eV, such as about 5.8 eV to about 6.8 eV, such as about 5.8 eV to about 6.7 eV, such as about 5.8 eV to about 6.5 eV, such as about 5.8 eV to about 6.3 eV, such as about 5.8 eV to about 6.2 eV, such as about 5.8 eV to about 6.1 eV; in the above range, such as about 6.0 eV to about 7.0 eV, such as about 6.0 eV to about 6.8 eV, such as about 6.0 eV to about 6.7 eV, such as about 6.0 eV to about 6.5 eV, such as about 6.0 eV to about 6.3 eV, such as about 6.0 eV to about 6.2 eV.

The quantum dot may have a shallow LUMO (lowest unoccupied molecular orbital) energy level whose absolute value is in a range of, for example, less than or equal to about 3.7 eV, in this range, such as less than or equal to about 3.6 eV, such as less than or equal to about 3.5 eV, such as less than or equal to about 3.4 eV, such as less than or equal to about 3.3 eV, such as less than or equal to about 3.2 eV, such as less than or equal to about 3.0 eV. In the above range, an absolute value of an LUMO energy level of a quantum dot layer may be in a range of about 2.5 eV to about 3.7 eV, about 2.5 eV to about 3.6 eV, about 2.5 eV to about 3.5 eV, about 2.5 eV to about 3.4 eV, about 2.5 eV to about 3.3 eV, about 2.5 eV to about 3.2 eV, about 2.5 eV to about 3.1 eV, about 2.5 eV to about 3.0 eV, about 2.8 eV to about 3.7 eV, about 2.8 eV to about 3.6 eV, about 2.8 eV to about 3.5 eV, about 2.8 eV to about 3.4 eV, about 2.8 eV to about 3.3 eV, about 2.8 eV to about 3.2 eV, about 3.0 eV to about 3.7 eV, about 3.0 eV to about 3.6 eV, about 3.0 eV to about 3.5 eV, or about 3.0 eV to about 3.4 eV.

The quantum dot may have an energy band gap in a range of about 1.7 eV to about 2.3 eV or about 2.4 eV to about 2.9 eV. In the respective ranges, for example, a quantum dot layer may have an energy band gap in a range of about 1.8 eV to about 2.2 eV or about 2.4 eV to about 2.8 eV, in the respective ranges, such as about 1.9 eV to about 2.1 eV, such as about 2.4 eV to about 2.7 eV.

In some other embodiments, in an example where the first light-emitting material is a non-photosensitive material, the first light-emitting material may include the quantum dots and non-photosensitive ligands. Alternatively, the first light-emitting material does not include ligands, and in this case, the first light-emitting material includes only the quantum dots.

In these embodiments, a specific material of the quantum dot may be selected according to the above description of the quantum dot, and will not be repeated here. In some embodiments, the first material has a carrier transport function.

That is, in these embodiments, the first material layer 134 may serve as a carrier transport layer or a carrier blocking layer. Whether the first material layer 134 serves as the carrier transport layer or the carrier blocking layer, the first material layer 134 is able to function to transport carriers. For example, the first material layer 134 may transmit electrons in a case where the first material layer 134 serves as the electron transport layer or a hole blocking layer, and the first material layer 134 may transmit holes in a case where the first material layer 134 serves the hole transport layer or an electron blocking layer. Compared with the first material layer 134 without the carrier transport function, carrier transport and light emission are not affected.

For example, in an example where the first material has the electron transport function, the first material layer 134 may serve as the electron transport layer or the hole blocking layer. In this case, an electron mobility of the first material may be in a range of $1 \times 10^{-4}$ cm$^2$/V·s to $2 \times 10^{-3}$ cm$^2$/V·s, inclusive, and the absolute value of the LUMO energy level may be in a range of 3.6 eV to 4.2 eV, inclusive. In an example where the first material has the hole transport function, the first material layer 134 may serve as the hole transport layer or the electron blocking layer. In this case, a hole mobility of the first material may be in a range of $1 \times 10^{-4}$ cm$^2$/V·s to $2 \times 10^{-3}$ cm$^2$/V·s, inclusive, and the absolute value of the HOMO energy level may be in a range of 5.1 eV to 6.2 eV, inclusive.

In some embodiments, as shown in FIG. 5A, each of the at least one first light-emitting device 13A further includes a carrier transport layer 300. The carrier transport layer 300 is disposed on a side of the first material layer 134 proximate to the substrate 11, and is in contact with the first material layer 134.

In these embodiments, in an example where the carrier transport layer 300 serves as the electron transport layer 133c, in a case where the first material has the carrier transport function, the first material layer 134 may serve as the hole blocking layer, and may also function to adjust the balance between the hole injection and the electron injection.

In some embodiments, carrier transport layer(s) 300 may be arranged as a whole layer.

In these embodiments, in addition to the at least one first light-emitting device 13A, the remaining light-emitting devices 13 in the plurality of light-emitting devices 13 each include a carrier transport layer.

The carrier transport layer 300 may be obtained by spin coating.

Figure 5D:
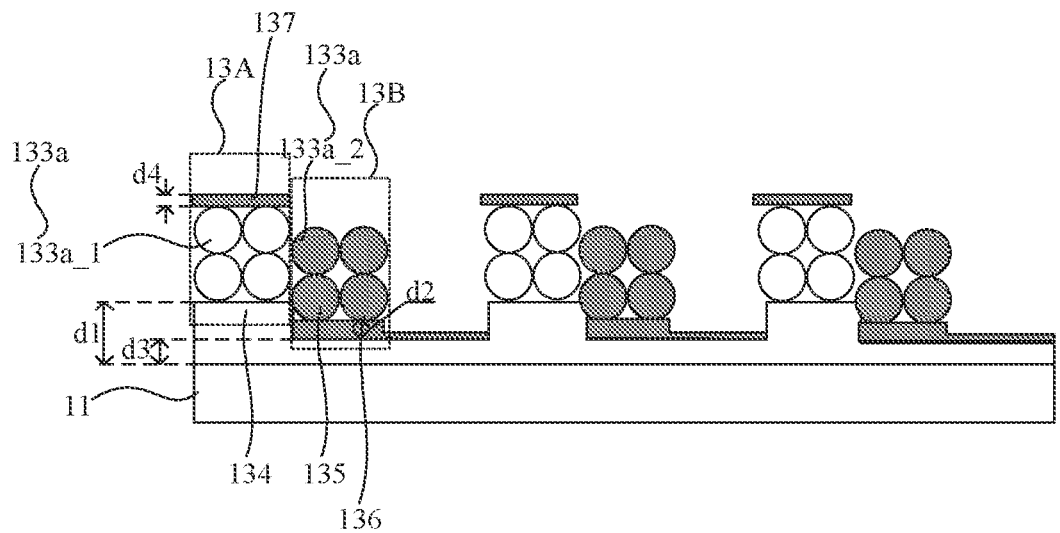
FIG. 5D is a sectional view of yet another light-emitting substrate, in accordance with some embodiments.

In some other embodiments, as shown in FIG. 5D, the first material layer 134 serves as the carrier transport layer 300, and is in direct contact with the first electrode 131.

In these embodiments, the first material layer 134 itself may realize the carrier transport function without additionally providing the carrier transport layer 300. Unlike the carrier transport layer(s) 300 that are arranged as the whole layer, the carrier transport layer 300 is disposed only in a region where the first light-emitting device 13A is located.

The above description is made only in the example where the first material layer 134 serves as the carrier transport layer 300, those skilled in the art can understand that the first material layer 134 may also serve as a carrier injection layer or a carrier blocking layer, both of which may achieve corresponding technical effects. Moreover, only the case that the first material layer 134 is in direct contact with the first electrode 131 is illustrated above, those skilled in the art can understand that a carrier injection layer may further be provided between the first material layer 134 and the first electrode 131 in a case where the first material layer 134 serves as the carrier transport layer 300. In this case, carrier injection layer(s) may also be arranged as a whole layer.

In some embodiments, as shown in FIG. 5A, in a case where each of the at least one first light-emitting device 13A further includes the carrier transport layer 300, a thickness d1 of the first material layer 134 is less than a thickness d of the carrier transport layer 300.

In these embodiments, in a case where the first material does not have the carrier transport function, the thickness d1 of the first material layer 134 is less than the thickness d of the carrier transport layer 300, so that an influence of an overlarge thickness d1 of the first material layer 134 on the carrier transport may be avoided. In the case where the first material has the carrier transport function, due to the existence of the carrier transport layer 300, the thickness d1 of the first material layer 134 is not required to be too large, as long as the first material layer 134 is able to function to pattern the quantum dot light-emitting material.

In some examples, as shown in FIG. 5A, in the case where the first material has the carrier transport function, the thickness d1 of the first material layer 134 is in a range of 5 nm to 20 nm, inclusive, and the thickness d of the carrier transport layer 300 is in a range of 50 nm to 70 nm, inclusive.

In some embodiments, in the case where the first material layer 134 serves as the carrier transport layer 300, the thickness d1 of the first material layer 134 is in a range of 50 nm to 70 nm, inclusive.

That is, in these embodiments, the carrier transport layer 300 may be omitted, and in this case, the thickness d1 of the first material layer 134 may be increased to the thickness of the carrier transport layer 300.

In some embodiments, in the case where each of the at least one first light-emitting device 13A further includes the carrier transport layer 300, a material of the carrier transport layer 300 includes metal nanoparticles and ligands bound to the metal nanoparticles. The metal nanoparticles included in the material of the carrier transport layer 300 are the same as or different from the metal nanoparticles included in the first material, and the ligands included in the material of the carrier transport layer 300 are different from the ligands included in the first material.

In these embodiments, in an example where the carrier transport layer 300 is the electron transport layer, and the metal nanoparticles included in the carrier transport layer 300 are zinc oxide nanoparticles, the metal nanoparticles included in the first material may also be zinc oxide nanoparticles. In this case, the first material may have the electron transport function. In order to pattern the first light-emitting material, the ligands included in the first material may be photosensitive ligands, the ligands included in the material of the carrier transport layer 300 may be non-photosensitive ligands (e.g., ethanolamine ligands), and the material of the carrier transport layer 300 is insoluble in the developer. In this way, the removal of the carrier transport layer 300 in a subsequent development process may be avoided, and the integrity of the carrier transport layer(s) 300 that are arranged as the whole layer may be maintained.

Here, it will be noted that in some embodiments, in the case where each of the at least one first light-emitting device 13A further includes the carrier transport layer 300, the first material may include photosensitive ligands. For example, the photosensitive ligands may be the same as the ligands included in the first light-emitting material. Similar to the fact that the first material includes the photosensitive ligands, and the ligands included in the first material are the same as the ligands included in the first light-emitting material, the first material and the first light-emitting material are able to have the same solubility in the same solvent, and the portion of the first film 10 and the portion of the second film 20 that are located in the remaining region except the region where the first light-emitting device(s) 13A are located are able to be eluted as a whole during development, thereby achieving the technical effect of completely eluting the red quantum dot light-emitting material. Unlike the case that the first material includes the photosensitive ligands, the first material may also perform a complexation reaction with a surface of the carrier transport layer 300 to generate a product in which zinc oxide, titanium oxide or nickel oxide is bound to the photosensitive ligands, which is equivalent to forming a material layer with a carrier transport function between the first material layer 134 and the carrier transport layer 300.

An HOMO energy level and/or an LUMO energy level of the first material layer 134 are not specifically limited. In a case where the material of the first material layer 134, i.e., the first material, does not have the carrier transport function, the thickness d1 of the first material layer 134 may be very small, and does not affect the carrier transport. In a case where the material of the first material layer 134, i.e., the first material, has the carrier transport function, the HOMO energy level and/or LUMO energy level of the first material layer 134 may be respectively matched with HOMO energy levels and/or LUMO energy levels of the carrier transport layer 300 and the first light-emitting pattern 133a_1.

In a case where the material of the first material layer 134 has the electron transport function, the LUMO energy level of the first material layer 134 may be between the LUMO energy level of the carrier transport layer 300 and the LUMO energy level of the first light-emitting pattern 133a_1. In a case where the material of the first material layer 134 has the hole transport function, the HOMO energy level of the first material layer 134 may be between the HOMO energy level of the carrier transport layer 300 and the HOMO energy level of the first light-emitting pattern 133a_1.

However, in a case where the material of the first material layer 134 includes the photosensitive ligands, and the material of the first material layer 134 and the surface of the carrier transport layer 300 generate the product in which zinc oxide or titanium oxide is bound to the photosensitive ligands, an LUMO energy level of the material layer with the carrier transport function that is formed between the carrier transport layer 300 and the first material layer 134 may be between the LUMO energy level of the carrier transport layer 300 and the LUMO energy level of the first light-emitting pattern 133a_1; similarly, in a case where the carrier transport layer 300 is made of nickel oxide, an HOMO energy level of the material layer with the carrier transport function that is formed between the carrier transport layer 300 and the first material layer 134 may be between the HOMO energy level of the carrier transport layer 300 and the HOMO energy level of the first light-emitting pattern 133a_1.

In some embodiments, as shown in FIG. 5A, the plurality of light-emitting devices 13 further include at least one second light-emitting device 13B. The at least one second light-emitting device 13B further includes a second material layer 135. The second material layer 135 is disposed on a side, proximate to the substrate 11, of a light-emitting pattern 133a (also referred to as a second light-emitting pattern 133a_2) included in the at least one second light-emitting device 13B, and is in contact with the light-emitting pattern 133a included in the at least one second light-emitting device 13B. A material of light-emitting pattern(s) 133a included in the at least one second light-emitting device 13B includes a second light-emitting material, and a material of second material layer(s) 135 includes a fourth material. The fourth material is capable of generating a fifth material under light irradiation of a third wavelength band, and a solubility of the fourth material and a solubility of the second light-emitting material are each different from a solubility of the fifth material in a same solvent. Alternatively, the fourth material is generated by a sixth material under light irradiation of a fourth wavelength band, and a solubility of the fourth material and a solubility of the second light-emitting material are each different from a solubility of the sixth material in a same solvent.

In these embodiments, each of the at least one second light-emitting device 13B may be a light-emitting device that can emit green light, so that the second light-emitting material may be a green quantum dot light-emitting material. Similar to the red quantum dot light-emitting material, in a case where the second light-emitting pattern(s) 133a_2 are formed on the substrate 11 on which the first material layer(s) 134 and the first light-emitting pattern(s) 133a_1 included in the at least one first light-emitting device 13A are formed, by adding the fourth material or the sixth material as a photoresist layer, it is also possible to solve a problem of a residue of the green quantum dot light-emitting material in the remaining region except a region where the second light-emitting device(s) 13B are located in the related art. Details may refer to the above description of adding the first material or the third material as the photoresist layer, and will not be repeated here.

It will be noted that the first material layer(s) 134 and the first light-emitting pattern(s) 133a_1 have been formed on the substrate 11 before the second material layer(s) 135 and the second light-emitting pattern(s) 133a_2 are manufactured. Here, there are two possible cases, depending on whether the first material layer 134 is in direct contact with the first electrode 131. In a first case, the first material layer 134 is in direct contact with the first electrode 131, and in this case, the first material layer 134 may serve as the carrier transport layer 300. In a second case, the first material layer 134 is not in direct contact with the first electrode 131, and in this case, each of the at least one first light-emitting device 13A may further include the carrier transport layer 300.

In any case, when the first material layer(s) 134 are manufactured, depending on physicochemical properties of a material, the second material C2 or the third material C3 in the remaining region except the region where the at least one first light-emitting device 13A is located may be completely removed or have a residue, which is not specifically limited herein.

In some embodiments, in an example where each of the at least one first light-emitting device 13A further includes the carrier transport layer 300, and the first material C1 has the carrier transport function, a material of the carrier transport layer 300 and the first material C1 each may be a material in which zinc oxide nanoparticles are bound to ligands. In this case, in an example where the first material C1 is generated by the third material C3 under the light irradiation of the second wavelength band, since there is an interaction force between the third material C3 and the carrier transport layer 300, in a case where the portion of the first film 10 located in the remaining region except the region where the at least one first light-emitting device 13A is located is removed by development subsequently, the portion of the first film 10 located in the remaining region except the region where the at least one first light-emitting device 13A is located cannot be completely removed, but has a small amount of residue.

For example, in some embodiments, as shown in FIG. 5A, each of the at least one second light-emitting device 13B further includes a third material layer 136. The third material layer 136 is disposed on a side of the second material layer 135 proximate to the substrate 11, and is in the same layer as the first material layer 134. A thickness d3 of the third material layer 136 is less than the thickness d1 of the first material layer 134.

That is, in these embodiments, the third material layer 136 may be a material layer of a residue of the first material or the third material in a region where the at least one second light-emitting device 13B is located after exposure and development. In this case, a material of the third material layer 136 is different from the material of the first material layer 134.

In a case where the material of the first film 10 includes the first material, the material of the third material layer 136 is generated by the first material under the light irradiation of the first wavelength band. That is, the material of the third material layer 136 is the second material. In a case where the material of the first film 10 includes the third material, the first material is generated by the third material under the light irradiation of the second wavelength band, and the material of the third material layer 136 is still the third material.

Here, in an example where the metal nanoparticles included in the material of the carrier transport layer 300 and the first material are zinc oxide nanoparticles, the ligands included in the material of the carrier transport layer 300 are ethanolamine ligands, and the ligands included in the first material and first light-emitting material are 2-Aminoethanethiol ligands, the first material layer 134 may be formed by the third material under the light irradiation of the second wavelength band. In this case, the ligands included in the materials of the first film 10 and second film 20 may be 2-(Boc-amino)ethanethiol (Boc) ligands. During practical applications, by adding a photoacid generator (e.g., 2,4-Bis (trichloromethyl)-6-(4-methoxystyryl)-1,3,5-triazine, PAG) into the first film 10 and the second film 20, and by using ultraviolet (UV) rays to irradiate the portion of the first film 10 and the portion of the second film 20 that are located in the region where the first light-emitting device(s) 13A are located, the portion of the first film 10 and the portion of the second film 20 that are located in the region where the first light-emitting device(s) 13A are located are changed into 2-Aminoethanethiol by removing the Boc group under light irradiation, so that the portion of the first film 10 and the portion of the second film 20 that are located in the region where the first light-emitting device(s) 13A are located are changed in polarity and solubility. In this case, the materials whose ligands remain Boc ligands without the UV irradiation may be removed by using a developer with a good solubility for the Boc group, such as chloroform, toluene, tetrahydrofuran, thereby obtaining the first material layer(s) 134 and the first light-emitting pattern(s) 133$a\_1$.

Thus, the ligands included in the material of the first material layer 134 are 2-Aminoethylthiol ligands, and the ligands included in the material of the third material layer 136 are Boc ligands.

The reaction equation of 2-(Boc-amino)ethanethiol under light irradiation may refer to the above description, and will not be repeated here.

It is found through experiments that in a case where the first material layer(s) 134 are not disposed, if the second film 20 is directly formed on the carrier transport layer(s) 300, during the subsequent development, since there is the interaction force between the portion of the second film 20 located in the remaining region except the region where the first light-emitting device(s) 13A is located and the carrier transport layer 300 (including ZnO nanoparticles and ethanolamine ligands), the portion of the second film 20 located in the remaining region except the region where the first light-emitting device(s) 13A are located forms a residue on the carrier transport layer 300. However, by adding a ZnO-Boc layer (i.e., the first material layer 134) with the same photosensitive ligands between the carrier transport layer 300 and the quantum dot light-emitting material, the ZnO-Boc layer and the quantum dot light-emitting material may be formed as a whole on the carrier transport layer 300, and a residue on the carrier transport layer 300 is ZnO and Boc instead of the quantum dot light-emitting material after development. Although the ZnO-Boc layer with the photosensitive ligands has the residue, ZnO and Boc themselves have no influence on the light emission.

Of course, only an example is described above, which illustrates the case that the ligands included in the materials of the first film 10 and second film 20 are 2-(Boc-amino) ethanethiol ligands. Those skilled in the art can understand that the ligands included in the materials of the first film 10 and second film 20 may be any ligands whose solubility is capable of being changed under light irradiation.

For example, in some embodiments, the ligands included in the materials of the first film 10 and second film 20 may be mono[2-[(2-methyl-acryloyl)oxy]ethyl]succinate (MMES) ligands. In this case, the material of the first film may be a complex in which zinc oxide nanoparticles are bound to the MMES ligands, which is denoted as ZnO-MMES here, and the material of the second film may be a complex in which the quantum dots are bound to the MMES ligands, which is denoted as QD-MMES here. Such ligand has the following characteristics: an end has groups for light crosslinking such as double bond(s), triple bond(s), acrylate bond(s) and ethylene oxide group(s), and another end has coordination groups such as mercapto, carboxyl and amino, during application, Diphenyl(2,4,6-trimethylbenzoyl)phosphine oxide (TPO) is used as the photoinitiator, and the double bonds at the tail ends of the MMES ligands are initiated to be crosslinked by using the free radicals generated by the TPO under light irradiation, thereby changing the solubility. In this case, in the subsequent development process, the ZnO-MMES and the QD-MMES that are unirradiated and uncrosslinked may be eluted by using propylene glycol methyl ether acetate (PMA) as the developer, and a ZnO-MMES cross-linked product and a QD-MMES crosslinked product after light irradiation and the cross-linking are retained, so that the first material layer(s) 134 and the first light-emitting pattern(s) 133$a\_1$ may also be formed.

Here, only examples of the first material layer 134 with the electron transport function are illustrated, and those skilled in the art can understand that the first material layer 134 with the hole transport function is also applicable.

In an example where the first material layer 134 has the hole transport function, the metal nanoparticles included in the material of the carrier transport layer 300 and the metal nanoparticles included in the material of the first material layer 134 may be nickel oxide nanoparticles. In this case, the material of the first film 10 may be a complex in which nickel oxide nanoparticles are bound to the photosensitive ligands. A specific coordination manner and a specific patterning process are similar to the case that the first material layer 134 has the electron transport function, and will not be repeated here.

Similar to the fact that the first material or the third material forms the residue in the remaining region except the region where the first light-emitting device(s) 13A are located, in a case where the second material layer(s) 135 and the second light-emitting pattern(s) 133a_2 are manufactured, the fourth material or the sixth material forms a residue in the remaining region except the region where the second light-emitting device(s) 13B are located. Details may refer to the description of the formation of the residue of the first material or the third material in the remaining region except the region where the first light-emitting device(s) 13A are located, and will not be repeated here.

Here, it will be noted that ligands included in the material of the second material layer 135 may be the same as or different from the ligands included in the material of the first material layer 134 and the material of the first light-emitting pattern 133a_1, which is not specifically limited here.

For example, the ligands included in the material of the second material layer 135 may be the same as the ligands included in the material of the first material layer 134 and the material of the first light-emitting pattern 133a_1, such as 2-Aminoethanethiol ligands. Alternatively, the ligands included in the material of the second material layer 135 may be different from the ligands included in the material of the first material layer 134 and the material of the first light-emitting pattern 133a_1. For example, in a case where the ligands included in the material of the first material layer 134 and the ligands included in the material of the first light-emitting pattern 133a_1 are 2-Aminoethanethiol ligands, ligands included in the material of the second material layer 135 and a material of the second light-emitting pattern 133a_2 may be products of MMES ligands after light irradiation, as long as the first material layer(s) 134 and the first light-emitting pattern(s) 133a_1 are not removed in a process of obtaining the second material layer(s) 135 and the second light-emitting pattern(s) 133a_2 through exposure and development.

In order to avoid removing the first material layer(s) 134 and the first light-emitting pattern(s) 133a_1 in the subsequent development process, the ligands included in the material of the second material layer 135 may be the same as the ligands included in the material of the first material layer 134 and the material of the first light-emitting pattern 133a_1, such as 2-Aminoethanethiol ligands, and in this case, the same developer is used, so that the first material layer(s) 134 and the first light-emitting pattern(s) 133a_1 are not removed.

In some embodiments, as shown in FIG. 5A, each of the at least one first light-emitting device 13A further includes a fourth material layer 137. The fourth material layer 137 is disposed on a side, away from the substrate 11, of the light-emitting pattern 133a included in the at least one first light-emitting device 13A, and is in contact with the light-emitting pattern 133a included in the at least one first light-emitting device 13A. A thickness d4 of the fourth material layer 137 is less than a thickness d2 of the second material layer 135.

In these embodiments, the fourth material layer 137 may be a material layer of a residue of the fourth material or the sixth material in the region where the at least one first light-emitting device 13A is located after exposure and development. In this case, a material of the fourth material layer 137 is different from the material of the second material layer 135, and the thickness d4 of the fourth material layer 137 is less than the thickness d2 of the second material layer 135.

In an example where the ligands included in the material of the second material layer 135 are the same as the ligands included in the material of the first material layer 134 and the material of the first light-emitting pattern 133a_1, such as 2-Aminoethylthiol ligands, the ligands included in the material of the second material layer 135 are 2-Aminoethylthiol ligands, and the ligands included in the material of the fourth material layer 137 are Boc ligands.

Figure 5E:
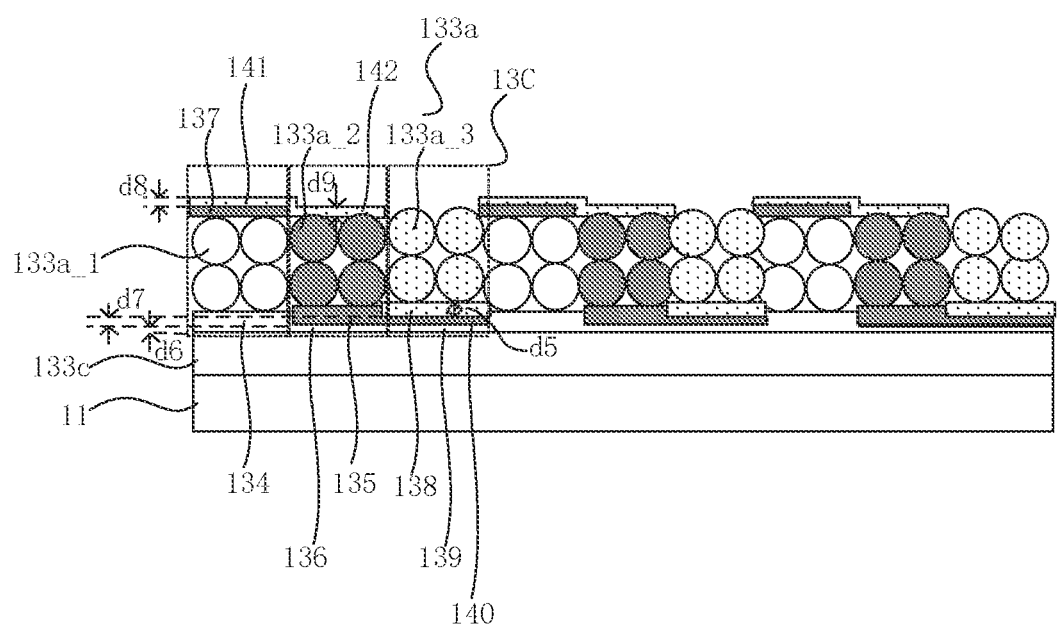
FIG. 5E is a sectional view of yet another light-emitting substrate, in accordance with some embodiments.

In some embodiments, as shown in FIG. 5E, the plurality of light-emitting devices 13 further include at least one third light-emitting device 13C. The at least one third light-emitting device 13C further includes a fifth material layer 138. The fifth material layer 138 is disposed on a side, proximate to the substrate 11, of a light-emitting pattern 133a (also referred to as a third light-emitting pattern 133a_3 here) included in the at least one third light-emitting device 13C, and is in contact with the light-emitting pattern 133a included in the at least one third light-emitting device 13C. A material of light-emitting pattern(s) 133a included in the at least one third light-emitting device 13C includes a third light-emitting material, and a material of fifth material layer(s) 138 includes a seventh material. The seventh material is capable of generating an eighth material under light irradiation of a fifth wavelength band, and a solubility of the seventh material and a solubility of the third light-emitting material are each different from a solubility of the eighth material in a same solvent. Alternatively, the seventh material is generated by a ninth material under light irradiation of a sixth wavelength band, and a solubility of the seventh material and a solubility of the third light-emitting material are each different from a solubility of the ninth material in a same solvent.

In these embodiments, each of the at least one third light-emitting device 13C may be a light-emitting device that can emit blue light, so that the third light-emitting material may be a blue quantum dot light-emitting material. Similar to the red quantum dot light-emitting material and the green quantum dot light-emitting material, in a case where the third light-emitting pattern(s) 133a_3 are formed on the substrate 11 on which the second material layer(s) 135 and the second light-emitting pattern(s) 133a_2 are formed, by adding the seventh material or the ninth material as a photoresist layer, it is also possible to solve a problem of color mixing caused by a residue of the blue quantum dot light-emitting material in the remaining region except a region where the third light-emitting device(s) 13C are located in the related art. Details may refer to the above description of adding the fourth material or the sixth material as the photoresist layer, and will not be repeated here.

Still as an example, each of the at least one first light-emitting device 13A further includes the carrier transport layer 300, the first material has the carrier transport function, the first material is generated by the third material under the light irradiation of the second wavelength band, and there is the interaction force between the third material (i.e., zinc oxide material with Boc ligands) and the material of the carrier transport layer, so that in the case where the portion of the first film 10 located in the remaining region except the region where the at least one first light-emitting device 13A is located is removed by development subsequently, the portion of the first film 10 located in the remaining region except the region where the at least one first light-emitting device 13A is located cannot be completely removed, but has the small amount of residue. A portion of the first film 10 located in the region where the at least one third light-emitting device 13C is located also forms a residue.

For example, in some embodiments, as shown in FIG. 5E, each of the at least one third light-emitting device 13C further includes a sixth material layer 139. The sixth material layer 139 is disposed on a side of the fifth material layer 138 proximate to the substrate 11, and is in the same layer as the first material layer 134. A thickness d6 of the sixth material layer 139 is less than the thickness d1 of the first material layer 134.

In these embodiments, the sixth material layer 139 may be a material layer of a residue of the first material or the third material in the region where the at least one third light-emitting device 13C is located after exposure and development. In this case, a material of the sixth material layer 139 is different from the material of the first material layer 134.

Still in the example where the ligands included in the material of the first material layer 134 are 2-Aminoethylthiol ligands, ligands included in the material of the sixth material layer 139 may be Boc ligands. In this case, the material of the sixth material layer 139 is the same as the material of the third material layer 136.

Similar to the fact that the first material or the third material forms the residue in the region where the third light-emitting device(s) 13C are located, in the case where the second material layer(s) 135 and the second light-emitting pattern(s) 133a_2 are manufactured, the fourth material or the sixth material also forms a residue in the region where the third light-emitting device(s) 13C are located.

For example, in some embodiments, as shown in FIG. 5E, each of the at least one third light-emitting device 13C further includes a seventh material layer 140. The seventh material layer 140 is disposed on a side of the fifth material layer 138 proximate to the substrate 11, and is in contact with the fifth material layer. A thickness d7 of the seventh material layer 140 is less than the thickness d2 of the second material layer 135.

In these embodiments, the seventh material layer 140 may be a material layer of the residue of the fourth material or the sixth material in the region where the at least one third light-emitting device 13C is located after exposure and development. In this case, a material of the seventh material layer 140 is different from the material of the second material layer 135, and the thickness d7 of the seventh material layer 140 is less than the thickness d2 of the second material layer 135.

Still in the example where the ligands included in the material of the second material layer 135 are 2-Aminoethiol ligands, ligands included in the material of the seventh material layer 140 may be Boc ligands. In this case, the material of the seventh material layer 140 may be the same as the material of the third material layer 136.

Similar to the fact that the first material or third material forms the residue in the remaining region except the region where the first light-emitting device(s) 13A are located, in a case where the fifth material layer(s) 138 and the third light-emitting pattern(s) 133a_3 are manufactured, the seventh material or the ninth material also forms a residue in the remaining region except the region where the third light-emitting device(s) 13C are located. Details may refer to the description of the formation of the residue of the first material or the third material in the remaining region except the region where the first light-emitting device(s) 13A are located, and will not be repeated here.

In addition, similar to the fact that the ligands included in the material of the second material layer 135 and the material of the second light-emitting pattern 133a_2 may be the same as or different from the ligands included in the material of the first material layer 134 and the material of the first light-emitting pattern 133a_1, ligands included in the material of the fifth material layer 138 and the material of the third light-emitting pattern 133a_3 may be the same as or different from the ligands included in the material of the first material layer 134 and the material of the first light-emitting pattern 133a_1, and may be the same as or different from the ligands included in the material of the second material layer 135 and the material of the second light-emitting pattern 133a_2, which is not specifically limited here, as long as the first material layer(s) 134, the first light-emitting pattern(s) 133a_1, the second material layer(s) 135 and the second light-emitting pattern(s) 133a_2 are not removed in a process of forming the fifth material layer(s) 138 and the third light-emitting pattern(s) 133a_3 subsequently.

In order to avoid removing the first material layer(s) 134, the first light-emitting pattern(s) 133a_1, the second material layer(s) 135 and the second light-emitting pattern(s) 133a_2 in the subsequent development process, the ligands included in the material of the fifth material layer 138 and the material of the third light-emitting pattern 133a_3 are the same as the ligands included in the material of the first material layer 134 and the material of the first light-emitting pattern 133a_1, and are the same as the ligands included in the material of the second material layer 135 and the material of the second light-emitting pattern 133a_2.

For example, in a case where the ligands included in the material of the first material layer 134 and the material of the first light-emitting pattern 133a_1 include 2-Aminoethanethiol ligands, and the ligands included in the material of the second material layer 135 and the material of the second light-emitting pattern 133a_2 include 2-Aminoethanethiol ligands, the ligands included in the material of the fifth material layer 138 and the material of the third light-emitting pattern 133a_3 may also include 2-Aminoethanethiol ligands.

In some embodiments, each of the at least one first light-emitting device 13A further includes an eighth material layer 141. The eighth material layer 141 is disposed on a side, away from the substrate 11, of the light-emitting pattern 133a included in the first light-emitting device 13A, and is in the same layer as the fifth material layer 138. A thickness d8 of the eighth material layer 141 is less than a thickness d5 of the fifth material layer 138.

In these embodiments, the eighth material layer 141 may be a material layer of a residue of the seventh material or the ninth material in the region where the at least one first light-emitting device 13A is located after exposure and development. In this case, a material of the eighth material layer 141 is different from the material of the fifth material layer 138, and the thickness d8 of the eighth material layer 141 is less than the thickness d5 of the fifth material layer 138.

In an example where the ligands included in the material of the fifth material layer 138 and the material of the third light-emitting pattern 133a_3 are the same as the ligands included in the material of the first material layer 134 and the material of the first light-emitting pattern 133a_1, and are the same as the ligands included in the material of the second material layer 135 and material of the second light-emitting pattern 133a_2, such as 2-Aminoethylthio ligands, the material of the eighth material layer 141 may be Boc.

In some embodiments, as shown in FIG. 5E, each of the at least one second light-emitting device 13B further includes a ninth material layer 142. The ninth material layer 142 is disposed on a side, away from the substrate 11, of the light-emitting pattern 133a included in the at least one second light-emitting device 13B, and is in the same layer as the fifth material layer 138. A thickness d9 of the ninth material layer 142 is less than the thickness d5 of the fifth material layer 138.

In these embodiments, the ninth material layer 142 may be a material layer of a residue of the seventh material or the ninth material in the region where the at least one second light-emitting device 13B is located after exposure and development. In this case, a material of the ninth material layer 142 is different from the material of the fifth material layer 138, and the thickness d9 of the ninth material layer 142 is less than the thickness d5 of the fifth material layer 138.

In the example where the ligands included in the material of the fifth material layer 138 and the material of the third light-emitting pattern 133a_3 are the same as the ligands included in the material of the first material layer 134 and the material of the first light-emitting pattern 133a_1, and are the same as the ligands included in the material of the second material layer 135 and material of the second light-emitting pattern 133a_2, such as 2-Aminoethylthio ligands, the material of the ninth material layer 142 may be Boc.

In this case, the material of the ninth material layer 142 is the same as the material of the eighth material layer 141.

In some embodiments, as shown in FIG. 5E, for light-emitting devices 13 with different colors, e.g., the first light-emitting device 13A, the second light-emitting device 13B and the third light-emitting device 13C, in a case where the material layers (e.g., the first material layer 134 included in the first light-emitting device 13A, the second material layer 135 included in the second light-emitting device 13B, and the fifth material layer 138 included in the third light-emitting device 13C), which are respectively in contact with the light-emitting patterns included in the light-emitting devices 13 and respectively disposed on sides, proximate to the substrate 11, of the light-emitting patterns 133a included in the light-emitting devices 13, each include metal nanoparticles and ligands bound to the metal nanoparticles, the metal nanoparticles included in each of the material layers (i.e., the first material layer 134, the second material layer 135 and the fifth material layer 138) are the same, e.g., zinc oxide nanoparticles, and at least one material layer (e.g., the first material layer 134, the second material layer 135 or the fifth material layer 138) includes metal nanoparticles doped with other metal(s).

The other metal(s) may be at least one metal different from Zn, e.g., magnesium (Mg), cobalt (Co), nickel (Ni), gallium (Ga), aluminum (Al), calcium (Ca), zirconium (Zr), tungsten (W), lithium (Li), titanium (Ti), tantalum (Ta), tin (Sn), hafnium (Hf), silicon (Si), barium (Ba), or a combination thereof.

A specific doping ratio may be $0.01 \leq x \leq 0.3$, e.g., $0.01 \leq x \leq 0.2$, and x is a subscript of Mg in $ZnMg_xO$.

In some embodiments, each of the material layers (i.e., the first material layer 134, the second material layer 135 and the fifth material layer 138) includes the metal nanoparticles doped with magnesium metal with a different doping amount.

For example, in some embodiments, a doping amount (i.e., mass ratio) of magnesium metal in the first material layer 134 is 5%, a doping amount (i.e., mass ratio) of magnesium metal in the second material layer 135 is 10%, and a doping amount (i.e., mass ratio) of magnesium metal in the fifth material layer 138 is 15%.

In these embodiments, a corresponding device structure may have an electron transport layer ZnO and an interface layer (i.e., the first material layer 134, the second material layer 135 or the fifth material layer 138), and the interface layer may be made of $ZnMgO-NH_2-SH$. The number of ligands in the interface layer is greater than the number of ligands in the electron transport layer. The balance between the electron injection and the hole injection may be adjusted by doping magnesium metal in the interface layer.

In some embodiments, the carrier transport layer 300 may also be doped with metal element(s), but a doping ratio of the carrier transport layer 300 is less than that of the interface layer.

Some embodiments of the present disclosure provide a manufacturing method of a light-emitting substrate. The manufacturing method includes as follows.

A plurality of light-emitting devices 13 are formed on a substrate 11. Each light-emitting device 13 includes a first electrode 131, a second electrode 132, and a light-emitting pattern 133a formed between the first electrode 131 and the second electrode 132. The first electrode 131 is closer to the substrate 11 than the second electrode 132. The plurality of light-emitting devices 13 include at least one first light-emitting device 13A, and each of the at least one first light-emitting device 13A further includes a first material layer 134. The first material layer 134 is formed on a side, proximate to the substrate 11, of a light-emitting pattern 133a (i.e., first light-emitting pattern 133a_1) included in the at least one first light-emitting device 13A, and is in contact with the light-emitting pattern 133a included in the at least one first light-emitting device 13A. A material of light-emitting pattern(s) 133a included in the at least one first light-emitting device 13A includes a first light-emitting material, and a material of first material layer(s) includes a first material. The first material is capable of generating a second material under light irradiation of a first wavelength band, and a solubility of the first material and a solubility of the first light-emitting material are each different from a solubility of the second material in a same solvent. Alternatively, the first material is generated by a third material under light irradiation of a second wavelength band, and the solubility of the first material and the solubility of the first light-emitting material are each different from a solubility of the third material in a same solvent.

The substrate 11 may be a substrate on which pixel driving circuits are formed. The first light-emitting device 13A may be a light-emitting device that can emit red light, and in this case, the first light-emitting material may be a red quantum dot light-emitting material. According to the fact that the material of the first material layer(s) includes the first material, and the first material is capable of generating the second material under the light irradiation of the first wavelength band, or the first material is generated by the third material under the light irradiation of the second wavelength band, it can be known that the first light-emitting material is patterned by using the first material as a positive photoresist, or the first light-emitting material is patterned by using the third material as a negative photoresist.

In following embodiments, a method of manufacturing the first material layer(s) and the first light-emitting pattern(s) will be described in an example where the first light-emitting material is patterned by using the third material as the negative photoresist.

Figure 6A:
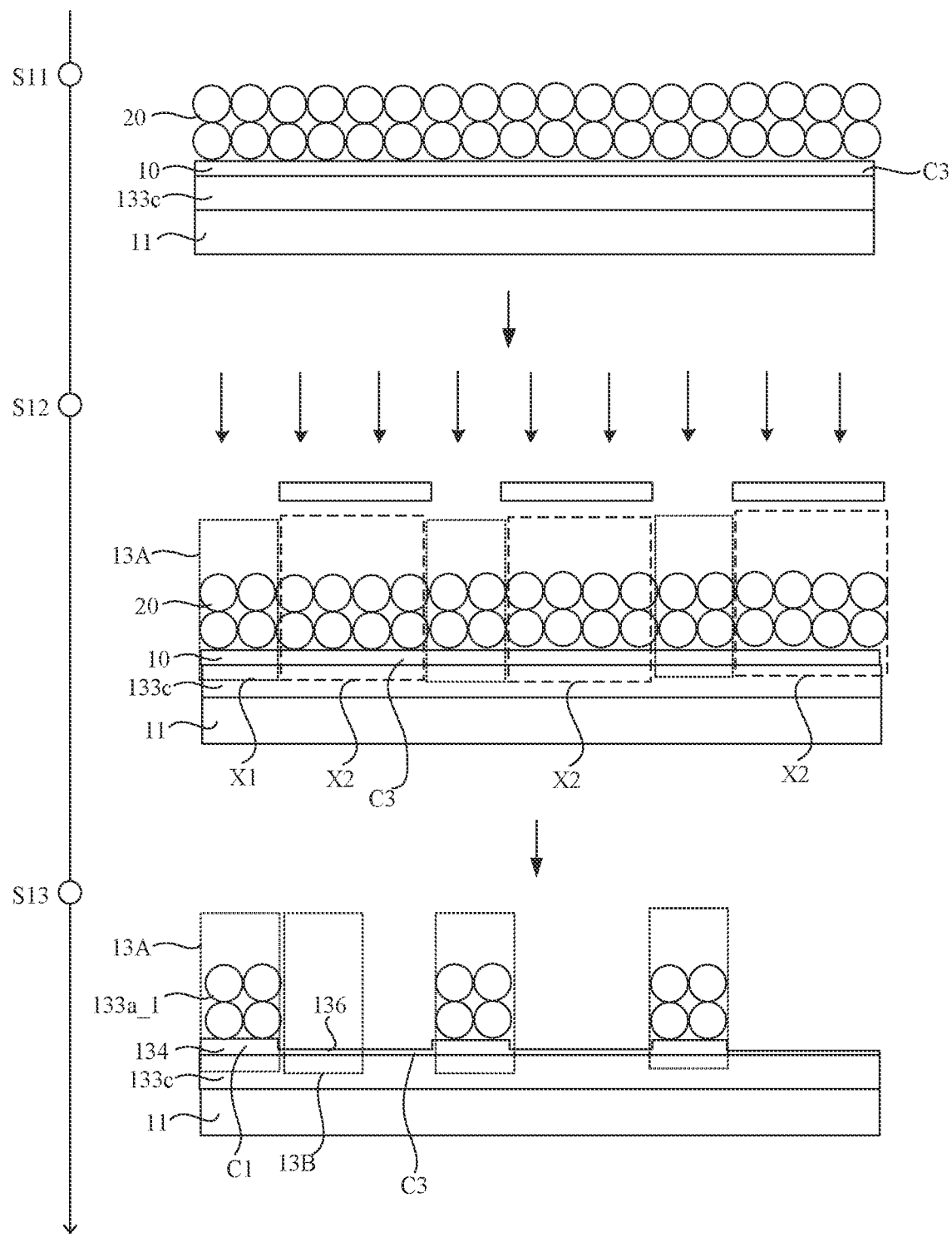
FIG. 6A is a flow diagram of forming first material layer(s) and first light-emitting pattern(s), in accordance with some embodiments.

In some embodiments, the first material is generated by the third material under the light irradiation of the second wavelength band, and a solubility of the first material and a solubility of the first light-emitting material in a first solvent are each less than a solubility of the third material in the first solvent. Forming the at least one first light-emitting device 13A, as shown in FIG. 6A, includes S11 to S13.

In S11, a first film 10 and a second film 20 are sequentially formed on the substrate 11. A material of the first film 10 includes the third material C3. A material of the second film 20 includes the first light-emitting material. Alternatively, the material of the second film 20 includes a tenth material, and the tenth material is capable of generating the first light-emitting material under the light irradiation of the second wavelength band.

In some embodiments, the first material C1 and the first light-emitting material each include metal nanoparticles and ligands bound to the metal nanoparticles. The ligands included in the first material C1 are the same as or different from the ligands included in the first light-emitting material. Moreover, in a case where the ligands included in the first material C1 are different from the ligands included in the first light-emitting material, the ligands included in the first light-emitting material are insoluble in the first solvent.

In these embodiments, in an example where the ligands included in the first material C1 are the same as the ligands included in the first light-emitting material, ligands included in the third material C3 may be photosensitive ligands, and ligands included in the tenth material may be photosensitive ligands. By using light of the second wavelength band to irradiate a portion of the first film 10 and a portion of the second film 20 that are located in a region where the first light-emitting device(s) 13A are located, the photosensitive ligands included in the third material C3 and the photosensitive ligands included in the tenth material may be changed, thereby obtaining the first material C1 and the first light-emitting material. In this process, since the ligands included in the third material C3 are the same as the ligands included in the tenth material, in a case where a portion of the first film 10 and a portion of the second film 20 that are located in a remaining region except the region where the first light-emitting device(s) 13A are located are removed, the portion of the first film 10 and the portion of the second film 20 that are located in the remaining region except the region where the first light-emitting device(s) 13A are located may be removed as a whole. Thus, the portion of the second film 20 located in the remaining region except the region where the first light-emitting device(s) 13A are located may be removed completely, thereby improving the patterning effect.

In an example where the ligands included in the first material C1 are different from the ligands included in the first light-emitting material, the ligands included in the third material C3 may be photosensitive ligands. In this case, there are two possible cases. In a first case, the material of the second film 20 includes the first light-emitting material, and the ligands included in the first light-emitting material are non-photosensitive ligands. In a second case, the material of the second film 20 includes the tenth material, and the ligands included in the tenth material may be photosensitive ligands, and are different from the ligands included in the third material. In any case, the ligands included in the first light-emitting material are insoluble in the first solvent.

In some embodiments, the photosensitive ligands include ligands capable of undergoing a decomposition reaction or a cross-linking reaction under the light irradiation of the second wavelength band.

For example, the photosensitive ligand may be a compound containing unsaturated group(s) or epoxy group(s), and the unsaturated group(s) or the epoxy group(s) undergo a cross-linking reaction after light irradiation to change the solubility. Alternatively, the photosensitive ligand may have amide bond(s) or ester bond(s), and the amide bond(s) or the ester bond(s) are deacylated after light irradiation to change the solubility.

In some embodiments, the photosensitive ligand includes any one of 2-(Boc-amino)ethanethiol (Boc) and Mono-2-(Methacryloyloxy)ethyl succinate (MMES).

In a case where the photosensitive ligand includes 2-(Boc-amino)ethanethiol, during application, in a presence of a photoacid generator (e.g., 2,4-Bis(trichloromethyl)-6-(4-methoxystyryl)-1,3,5-triazine, PAG), 2-(Boc-amino)ethanethiol may be changed into 2-Aminoethanethiol by removing a Boc group under ultraviolet (UV) irradiation, thereby changing the solubility. In a case where the photosensitive ligand includes MMES (such ligand has following characteristics: an end has groups for light crosslinking such as double bond(s), triple bond(s), acrylate bond(s) and ethylene oxide group(s), and another end has coordination groups such as mercapto, carboxyl and amino), during application, Diphenyl(2,4,6-trimethylbenzoyl)phosphine oxide (TPO) serves as a photoinitiator, and double bonds at tail ends of the MMES ligands are initiated to be crosslinked by using free radicals generated by the TPO under light irradiation, thereby changing the solubility.

The reaction equation of 2-(Boc-amino)ethanethiol under light irradiation may refer to the above description, and will not be repeated here.

In S12, the portion of the first film 10 and the portion of the second film 20 that are located in a first region X1 are irradiated by using the light of the second wavelength band, so that the portion of the first film 10 located in the first region X1 generates the first material. The first region X1 is the region where the at least one first light-emitting device 13A is located.

For example, in an example where the third material C3 is a material in which zinc oxide is bound to 2-(Boc-amino)ethanethiol (Boc), under the light irradiation of the second wavelength band, the portion of the first film 10 located in the first region X1 generates a material in which zinc oxide is bound to 2-Aminoethanethiol.

In S13, the portion of the first film 10 located in a second region X2 is dissolved by using the first solvent, so as to remove the portion of the first film 10 located in the second region X2 and the portion of the second film 20 located in the second region X2, so that the first material layer(s) 134 and the first light-emitting pattern(s) 133a_1 are obtained. The second region X2 is the remaining region of the plurality of light-emitting devices 13 except the region where the at least one first light-emitting device 13A is located.

The first solvent is a developer. In this case, since the solubility of the first material C1 and the solubility of the first light-emitting material in the first solvent are each less than the solubility of the third material C3 in the first solvent, when the first solvent is used to dissolve the portion of the first film 10 located in the second region X2, the portion of the first film 10 and the portion of the second film 20 that are located in the first region X1 are able to be retained, so as to pattern the first light-emitting material.

Compared with the fact that the quantum dot light-emitting material is patterned by using the direct photolithography method in the related art, a formation of a residue of the red quantum dot light-emitting material in a region where light-emitting devices with other colors are located may be avoided, thereby solving the problem of color mixing caused by the quantum dot light-emitting materials. Compared with the fact that the quantum dot light-emitting material is patterned by using the sacrificial layer in the related art, by selecting the materials, the solubility of the first light-emitting material is different from the solubility of the second material C2 as a sacrificial layer in the same solvent or the solubility of the third material C3 as a sacrificial layer in the same solvent, so that the first light-emitting material may be prevented from being removed in a subsequent development process, thereby solving the problem of the loss of the quantum dot light-emitting material in the related art.

In some embodiments, the plurality of light-emitting devices 13 further include at least one second light-emitting device 13B. Each of the at least one second light-emitting device 13B further includes a second material layer 135. The second material layer 135 is disposed on a side, proximate to the substrate 11, of a light-emitting pattern 133a (i.e., second light-emitting pattern 133a_2) included in the at least one second light-emitting device 13B, and is in contact with the light-emitting pattern 133a included in the at least one second light-emitting device 13B. A material of light-emitting pattern(s) 133a included in the at least one second light-emitting device 13B includes a second light-emitting material, and a material of second material layer(s) 135 included in the at least one second light-emitting device 13B includes a fourth material. The fourth material is capable of generating a fifth material under light irradiation of a third wavelength band, and a solubility of the fourth material and a solubility of the second light-emitting material are each different from a solubility of the fifth material in a same solvent. Alternatively, the fourth material is generated by a sixth material under light irradiation of a fourth wavelength band, and the solubility of the fourth material and the solubility of the second light-emitting material are each different from a solubility of the sixth material in a same solvent.

The second light-emitting device 13B may be a light-emitting device that can emit green light, so that the second light-emitting material may be a green quantum dot light-emitting material.

Similar to the fact that the first light-emitting material is patterned by using the first material as the positive photoresist, or the first light-emitting material is patterned by using the third material as the negative photoresist, the second light-emitting material may be patterned by using the fourth material as a positive photoresist, or the second light-emitting material may be patterned by using the sixth material as a negative photoresist.

In following embodiments, a method of manufacturing the second material layer(s) and the second light-emitting pattern(s) will be described in an example where the second light-emitting material is patterned by using the sixth material as the negative photoresist.

Figure 6B:
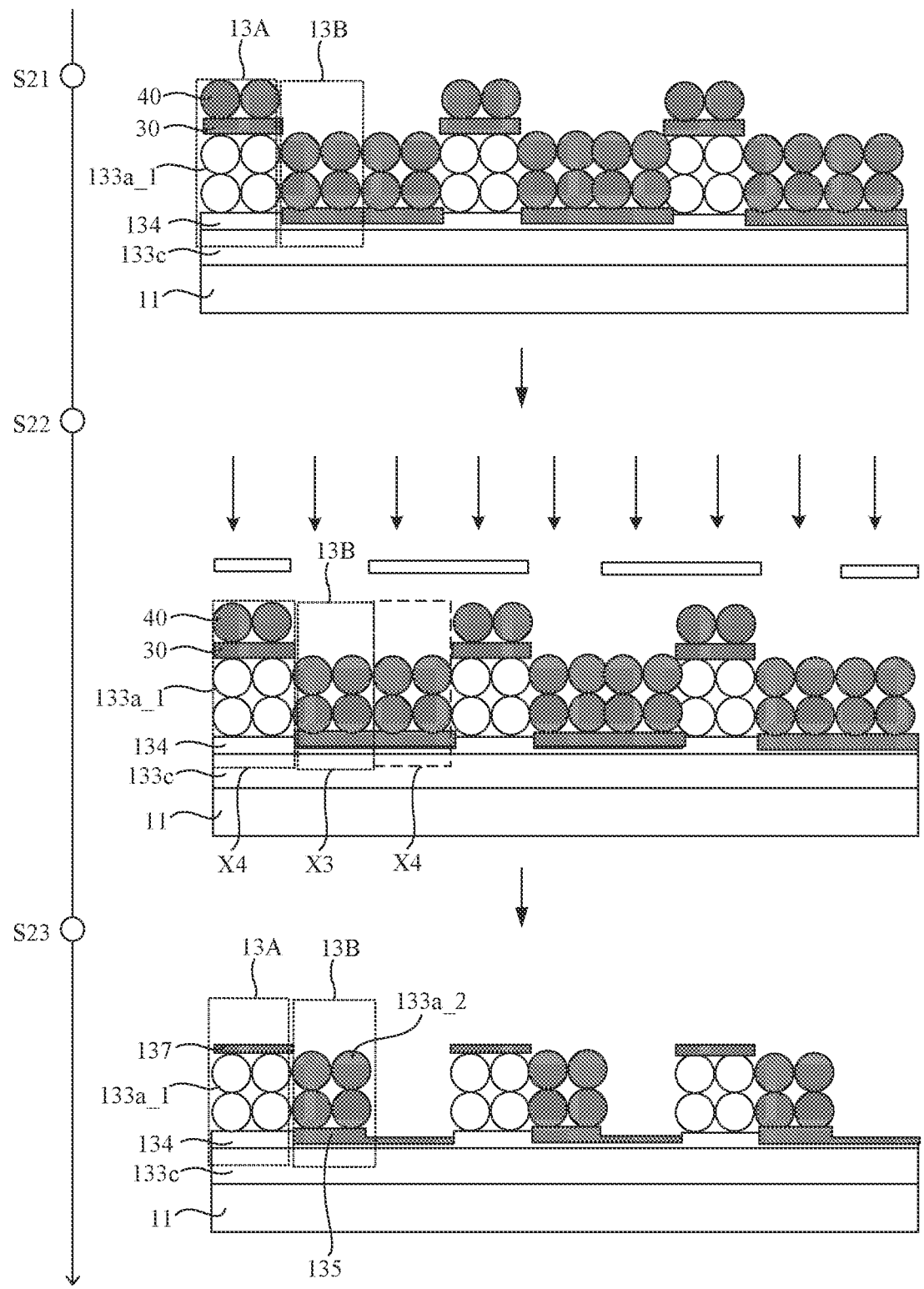
FIG. 6B is a flow diagram of forming second material layer(s) and second light-emitting pattern(s), in accordance with some embodiments.

In some embodiments, the fourth material is generated by the sixth material under the light irradiation of the fourth wavelength band, and a solubility of the fourth material and a solubility of the second light-emitting material in a second solvent are each less than a solubility of the sixth material in the second solvent. Forming the at least one second light-emitting device 13B, as shown in FIG. 6B, includes S21 to S23.

In S21, a third film 30 and a fourth film 40 are sequentially formed on the substrate 11 on which the first material layer(s) 134 and the first light-emitting pattern(s) 133a_1 are formed. A material of the third film 30 includes the sixth material. A material of the fourth film 40 includes the second light-emitting material. Alternatively, the material of the fourth film 40 includes an eleventh material, and the eleventh material is capable of generating the second light-emitting material under the light irradiation of the fourth wavelength band.

For example, the fourth material may be a material with an electron transport function, such as a material in which zinc oxide is bound to 2-Aminoethanethiol. In this case, the sixth material may be a material in which zinc oxide is bound to 2-(Boc-amino)ethanethiol (Boc). Under the light irradiation of the fourth wavelength band, Boc may be deacylated to generate 2-Aminoethanethiol, thereby obtaining the fourth material.

In some embodiments, the fourth material and the second light-emitting material each include metal nanoparticles and ligands bound to the metal nanoparticles. The ligands included in the fourth material are the same as or different from the ligands included in the second light-emitting material. Moreover, in a case where the ligands included in the fourth material are different from the ligands included in the second light-emitting material, the ligands included in the second light-emitting material are insoluble in the second solvent.

In these embodiments, in an example where the ligands included in the fourth material are the same as the ligands included in the second light-emitting material, ligands included in the sixth material may be photosensitive ligands, and ligands included in the eleventh material may be photosensitive ligands. By using light of the fourth wavelength band to irradiate a portion of the third film 30 and a portion of the fourth film 40 that are located in a region where the second light-emitting device(s) 13B are located, the photosensitive ligands included in the sixth material and the photosensitive ligands included in the eleventh material may be changed, thereby obtaining the fourth material and the second light-emitting material. In this process, since the ligands included in the sixth material are the same as the ligands included in the eleventh material, in a case where a portion of the third film 30 and a portion of the fourth film 40 that are located in a remaining region except the region where the second light-emitting device(s) 13B are located are removed, the portion of the third film 30 and the portion of the fourth film 40 that are located in the remaining region except the region where the second light-emitting device(s) 13B are located may be removed as a whole. Thus, the portion of the fourth film 40 located in the remaining region except the region where the second light-emitting device(s) 13B are located may be removed completely, thereby improving the patterning effect.

In an example where the ligands included in the fourth material are different from the ligands included in the second light-emitting material, the ligands included in the sixth material may be photosensitive ligands. In this case, there are two possible cases. In a first case, the material of the fourth film 40 includes the second light-emitting material, and the ligands included in the second light-emitting material are non-photosensitive ligands. In a second case, the material of the fourth film 40 includes the eleventh material, and the ligands included in the eleventh material may be photosensitive ligands, and are different from the ligands included in the sixth material. In any case, the ligands included in the second light-emitting material are insoluble in the second solvent.

In some embodiments, the photosensitive ligands include ligands capable of undergoing a decomposition reaction or a cross-linking reaction under the light irradiation of the fourth wavelength band.

For example, the photosensitive ligand may be a compound containing unsaturated group(s) or epoxy group(s), and the unsaturated group(s) or the epoxy group(s) undergo a cross-linking reaction after light irradiation to change the solubility. Alternatively, the photosensitive ligand may have amide bond(s) or ester bond(s), and the amide bond(s) or the ester bond(s) are deacylated after light irradiation to change the solubility.

In some embodiments, the photosensitive ligand includes any one of 2-(Boc-amino)ethanethiol (Boc) and Mono-2-(Methacryloyloxy)ethyl succinate (MMES).

Specific applications may refer to the above description, and will not be repeated here.

In S22, the portion of the third film 30 and the portion of the fourth film 40 that are located in a third region X3 are irradiated by using the light of the fourth wavelength band, so that the portion of the third film 30 located in the third region X3 generates the fourth material. The third region X3 is the region where the at least one second light-emitting device 13B is located.

For example, in an example where the sixth material is a material in which zinc oxide is bound to 2-(Boc-amino) ethanethiol (Boc), under the light irradiation of the fourth wavelength band, the portion of the third film 30 located in the third region X3 generates a material in which zinc oxide is bound to 2-Aminoethanethiol.

In S23, the portion of the third film 30 located in a fourth region X4 is dissolved by using the second solvent, so as to remove the portion of the third film 30 and the portion of the fourth film 40 that are located in the fourth region X4, so that the second material layer(s) 135 and the second light-emitting pattern(s) 133a_2 are obtained. The fourth region X4 is the remaining region of the plurality of light-emitting devices 13 except the region where the at least one second light-emitting device 13B is located.

The second solvent is a developer. In this case, since the solubility of the fourth material and the solubility of the second light-emitting material in the second solvent are each less than the solubility of the sixth material in the second solvent, when the second solvent is used to dissolve the portion of the third film 30 located in the fourth region X4, the portion of the third film 30 and the portion of the fourth film 40 that are located in the third region X3 are able to be retained, so as to pattern the second light-emitting material.

Compared with the fact that the quantum dot light-emitting material is patterned by using the direct photolithography method in the related art, a formation of a residue of the green quantum dot light-emitting material in a region where light-emitting devices with other colors are located may be avoided. Compared with the fact that the quantum dot light-emitting material is patterned by using the sacrificial layer in the related art, by selecting the materials, the solubility of the second light-emitting material is different from the solubility of the fifth material as a sacrificial layer in the same solvent or the solubility of the sixth material as a sacrificial layer in the same solvent, so that the second light-emitting material may be prevented from being removed in a subsequent development process, thereby solving the problem of the loss of the quantum dot light-emitting material in the related art.

In some embodiments, the plurality of light-emitting devices 13 further include at least one third light-emitting device 13C. Each of the at least one third light-emitting device 13C further includes a fifth material layer 138. The fifth material layer 138 is disposed on a side, proximate to the substrate 11, of a light-emitting pattern 133a (i.e., a third light-emitting pattern 133a_3) included in the at least one third light-emitting device 13C, and is in contact with the light-emitting pattern 133a included in the at least one third light-emitting device 13C. A material of light-emitting pattern(s) 133a included in the third light-emitting device(s) 13C includes a third light-emitting material, and a material of fifth material layer(s) 138 included in the third light-emitting device(s) 13C includes a seventh material. The seventh material is capable of generating an eighth material under light irradiation of a fifth wavelength band, and a solubility of the seventh material and a solubility of the third light-emitting material are each different from a solubility of the eighth material in a same solvent. Alternatively, the seventh material is generated by a ninth material under light irradiation of a sixth wavelength band, and the solubility of the seventh material and the solubility of the third light-emitting material are each different from a solubility of the ninth material in a same solvent.

Here, a method of manufacturing the fifth material layer(s) 138 and the third light-emitting pattern(s) 133a_3 will be described in an example where the seventh material is generated by the ninth material under the light irradiation of the sixth wavelength band, and a solubility of the seventh material and a solubility of the third light-emitting material in a third solvent are each less than a solubility of the ninth material in the third solvent.

Figure 6C:
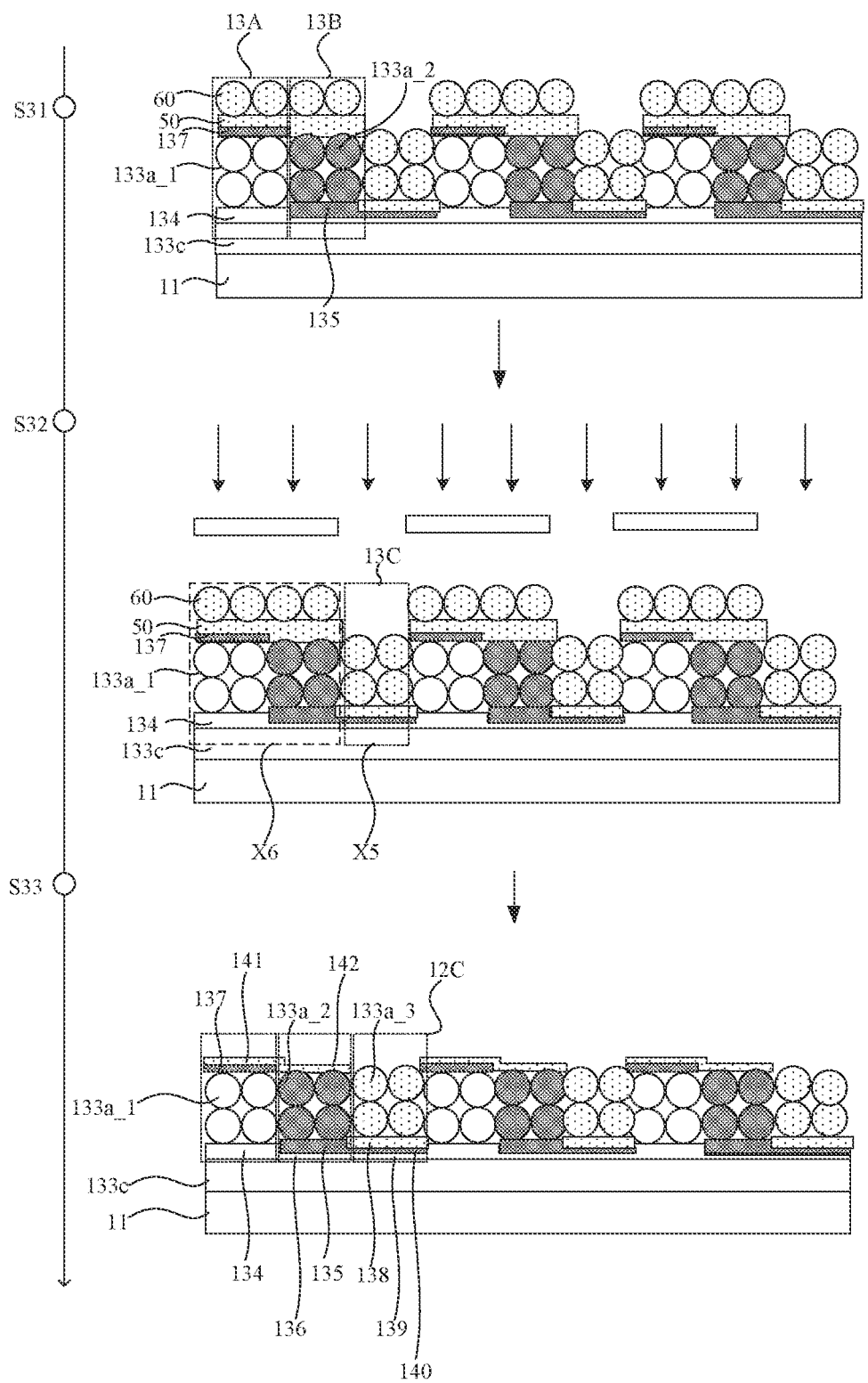
FIG. 6C is a flow diagram of forming third material layer(s) and third light-emitting pattern(s), in accordance with some embodiments.

In some embodiments, forming the at least one third light-emitting device 13C, as shown in FIG. 6C, includes S31 to S33.

In S31, a fifth film 50 and a sixth film 60 are sequentially formed on the substrate 11 on which the second material layer(s) 135 and the second light-emitting pattern(s) 133a_2 are formed. A material of the fifth film 50 includes the ninth material. A material of the sixth film 60 includes a third light-emitting material. Alternatively, the material of the sixth film 60 includes a twelfth material, and the twelfth material is capable of generating the third light-emitting material under the light irradiation of the sixth wavelength band.

For example, the ninth material may also be a material with an electron transport function. For example, the third light-emitting material may be a blue quantum dot light-emitting material.

In some embodiments, the seventh material and the third light-emitting material each include metal nanoparticles and ligands bound to the metal nanoparticles. The ligands included in the seventh material are the same as or different from the ligands included in the third light-emitting material. Moreover, in a case where the ligands included in the seventh material are different from the ligands included in the third light-emitting material, the ligands included in the third light-emitting material are insoluble in the third solvent.

In these embodiments, in an example where the ligands included in the seventh material are the same as the ligands included in the third light-emitting material, ligands included in the ninth material may be photosensitive ligands, and ligands included in the twelfth material may be photosensitive ligands. By using light of the sixth wavelength band to irradiate a portion of the fifth film 50 and a portion of the sixth film 60 that are located in a region where the third light-emitting device(s) 13C are located, the photosensitive ligands included in the ninth material and the photosensitive ligands included in the twelfth material may be changed, thereby obtaining the seventh material and the third light-emitting material. Since the ligands included in the ninth material are the same as the ligands included in the twelfth material, in a case where a portion of the fifth film 50 and a portion of the sixth film 60 that are located in a remaining region except the region where the third light-emitting device(s) 13C are located are removed, the portion of the fifth film 50 and the portion of the sixth film 60 that are located in the remaining region except the region where the third light-emitting device(s) 13C are located may be removed as a whole. Thus, the portion of the sixth film 60 located in the remaining region except the region where the third light-emitting device(s) 13C are located may be removed completely, thereby improving the patterning effect.

In an example where the ligands included in the seventh material are different from the ligands included in the third light-emitting material, the ligands included in the ninth material may be photosensitive ligands. In this case, there are two possible cases. In a first case, the material of the sixth film 60 includes the third light-emitting material, and the ligands included in the third light-emitting material are non-photosensitive ligands. In a second case, the material of the sixth film 60 includes the twelfth material, and the ligands included in the twelfth material may be photosensitive ligands, and are different from the ligands included in the ninth material. In any case, the ligands included in the third light-emitting material are insoluble in the third solvent.

In some embodiments, the photosensitive ligands include ligands capable of undergoing a decomposition reaction or a cross-linking reaction under the light irradiation of the sixth wavelength band.

For example, the photosensitive ligand may be a compound containing unsaturated group(s) or epoxy group(s), and the unsaturated group(s) or the epoxy group(s) undergo a cross-linking reaction after light irradiation to change the solubility. Alternatively, the photosensitive ligand may have amide bond(s) or ester bond(s), and the amide bond(s) or the ester bond(s) are deacylated after light irradiation to change the solubility.

In some embodiments, the photosensitive ligand includes any one of 2-(Boc-amino)ethanethiol (Boc) and Mono-2-(Methacryloyloxy)ethyl succinate (MMES).

Specific applications may refer to the above description, and will not be repeated here.

In S32, the portion of the fifth film 50 and the portion of the sixth film 60 that are located in a fifth region X5 are irradiated by using the light of the sixth wavelength band, so that the portion of the fifth film 50 located in the fifth region X5 generates the seventh material. The fifth region X5 is the region where the at least one third light-emitting device 13C is located.

For example, in an example where the ninth material is a material in which zinc oxide is bound to 2-(Boc-amino) ethanethiol (Boc), under the light irradiation of the sixth wavelength band, the portion of the fifth film 50 located in the fifth region X5 generates a material in which zinc oxide is bound to 2-Aminoethanethiol.

In S33, the portion of the fifth film 50 located in a sixth region X6 is dissolved by using the third solvent, so as to remove the portion of the fifth film 50 located in the sixth region X6 and the portion of the sixth film 60 located in the sixth region X6, so that the fifth material layer(s) 138 and the third light-emitting pattern(s) 133a_3 are obtained. The sixth region X6 is the remaining region of the plurality of light-emitting devices 13 except the region where the at least one third light-emitting device 13C is located.

The third solvent is a developer. In this case, since the solubility of the seventh material and the solubility of the third light-emitting material in the third solvent are each less than the solubility of the ninth material in the second solvent, when the third solvent is used to dissolve the portion of the fifth film 50 located in the sixth region X6, the portion of the fifth film 50 and the portion of the sixth film 60 that are located in the fifth region X5 are able to be retained, so as to pattern the third light-emitting material.

Compared with the fact that the quantum dot light-emitting material is patterned by using the direct photolithography method in the related art, a formation of a residue of the blue quantum dot light-emitting material in a region where light-emitting devices with other colors are located may be avoided. Compared with the fact that the quantum dot light-emitting material is patterned by using the sacrificial layer in the related art, by selecting the materials, the solubility of the third light-emitting material is different from the solubility of the eighth material as a sacrificial layer in the same solvent or the solubility of the ninth material as a sacrificial layer in the same solvent, so that the third light-emitting material may be prevented from being removed in a subsequent development process, thereby solving the problem of the loss of the quantum dot light-emitting material in the related art.

In summary, by adding a material layer as a photoresist layer before each color of quantum dot light-emitting material is formed, a residue of each color of quantum dot light-emitting material may be converted into a residue of the foregoing material layer, thereby solving the problem of color mixing caused by the residue of the quantum dot light-emitting material in the previous layer after the patterning process of the next color of quantum dot light-emitting material in the related art. Compared with the fact that the quantum dot light-emitting material is patterned by using the sacrificial layer in the related art, by selecting the materials, a solubility of each layer of quantum dot light-emitting material is different from a solubility of a portion of the added material layer as a sacrificial layer in a same solvent, so that on one hand, each layer of quantum dot light-emitting material may be prevented from being removed in a subsequent development process, and on another hand, by selecting the three layers of quantum dot light-emitting materials and the material layers respectively corresponding thereto, the solubility of each layer of quantum dot light-emitting material is different from the solubility of the portion of the added material layer as the sacrificial layer in the same solvent, which may avoid the problem of the loss of the previously formed quantum dot light-emitting material in the subsequent development process.

Based on the above detailed description, in order to objectively evaluate the technical effects of the technical solutions in the present disclosure, the technical effects of the technical solutions in the present disclosure were verified below through following verification tests.

Verification tests:

Firstly, ZnO-Boc and GQD-Boc were manufactured by ligand exchange. Next, ZnO (with a thickness of about 25 nm) and GQD-Boc (with a thickness of about 30 nm) were sequentially spin-coated on a first white glass. Then, GQD- Boc was developed by using chloroform, and ultraviolet-visible absorption spectra of ZnO and ZnO/GQD-Boc/CCl3 were tested. Similarly, ZnO (with a thickness of about 25 nm), ZnO-Boc (with a thickness of about 5 nm) and GQD-Boc (with a thickness of about 30 nm) were sequentially spin-coated on a second white glass. Then, ZnO-Boc and GQD-Boc were developed by using chloroform, and ultraviolet-visible absorption spectra of ZnO/ZnO-Boc and ZnO/ZnO-Boc/GQD-Boc/CCl$_3$ were tested.

The ultraviolet-visible absorption spectrum of ZnO refers to an ultraviolet absorption spectrum of an obtained film layer after ZnO was spin-coated on the first white glass. The ultraviolet-visible absorption spectrum of ZnO/GQD-Boc/CCl$_3$ refers to an ultraviolet absorption spectrum of an obtained film layer after ZnO and GQD-Boc were sequentially spin-coated on the first white glass, and GQD-Boc was dissolved with chloroform. The ultraviolet-visible absorption spectrum of ZnO/ZnO-Boc refers to an ultraviolet absorption spectrum of an obtained film layer after ZnO and ZnO-Boc were sequentially spin-coated on the second white glass. The ultraviolet-visible absorption spectrum of ZnO/ZnO-Boc/GQD-Boc/CCl$_3$ refers to an ultraviolet absorption spectrum of an obtained film layer after ZnO, ZnO-Boc and GQD-Boc were sequentially spin-coated on the second white glass, and ZnO-Boc and GQD-Boc were dissolved with chloroform.

Figure 7:
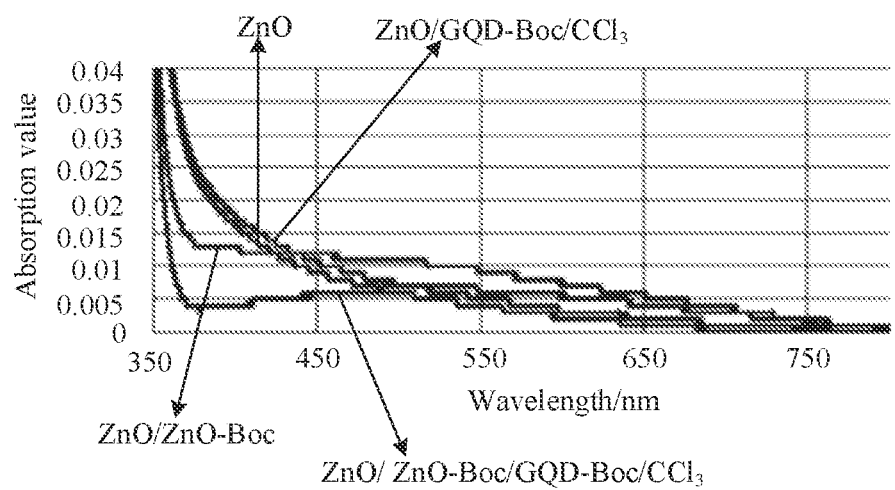
FIG. 7 is a comparison diagram of ultraviolet absorption spectra of ZnO, ZnO/GQD-Boc/CCl$_3$, ZnO/ZnO-Boc and ZnO/ZnO-Boc/GQD-Boc/CCl$_3$, in accordance with some embodiments.

Test results of the ultraviolet absorption spectra of the film layers are shown in FIG. 7. It can be seen from FIG. 7 that compared with the ultraviolet-visible absorption spectrum of ZnO, an absorption value of ZnO/GQD-Boc/CCl$_3$ in a wavelength range of 450 nm to 750 nm is greater than an absorption value of ZnO in the wavelength range of 450 nm to 750 nm. This indicates that after GQD-Boc was directly spin-coated on ZnO, and was dissolved with chloroform, GQD-Boc had a certain residue on ZnO. Compared with the ultraviolet-visible absorption spectrum of ZnO, an absorption value of ZnO/ZnO-Boc in the wavelength range of 450 nm to 750 nm is higher, which indicates that a film layer different from ZnO was spin-coated on ZnO. Next, based on the ultraviolet absorption spectrum of ZnO/ZnO-Boc, it can be seen that an absorption value of ZnO/ZnO-Boc/GQD-Boc/CCl$_3$ in the wavelength range of 450 nm to 750 nm is decreased compared with the absorption value of ZnO/ZnO-Boc, and the ultraviolet absorption spectrum of ZnO/ZnO-Boc/GQD-Boc/CCl$_3$ is consistent with the ultraviolet absorption spectrum of ZnO/ZnO-Boc. This indicates that a small amount of ZnO-Boc was eluted when GQD-Boc was dissolved with chloroform, and GQD-Boc had no residue on ZnO.

Moreover, ZnO/GQD-Boc/CCl$_3$ and ZnO/ZnO-Boc/GQD-Boc/CCl$_3$ were irradiated by using an ultraviolet lamp. It was seen that ZnO/GQD-Boc/CCl$_3$ exhibited a distinct green color, and ZnO/ZnO-Boc/GQD-Boc/CCl$_3$ exhibited no green color.

In summary, by adding the ZnO-Boc layer, the problem of the quantum dot residue caused by the direct photolithography method in the related art may be solved.

The foregoing descriptions are merely specific implementations of the present disclosure. However, the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting substrate, comprising:
   a substrate; and
   a plurality of light-emitting devices disposed on the substrate; wherein each light-emitting device includes a first electrode, a second electrode, and a light-emitting pattern disposed between the first electrode and the second electrode, and the first electrode is closer to the substrate than the second electrode; wherein
   the plurality of light-emitting devices include at least one first light-emitting device; the at least one first light-emitting device further includes a first material layer; the first material layer is disposed on a side, proximate to the substrate, of a light-emitting pattern included in the at least one first light-emitting device, and is in contact with the light-emitting pattern included in the at least one first light-emitting device;
   wherein a material of the light-emitting pattern included in the at least one first light-emitting device includes a first light-emitting material, and a material of the first material layer includes a first material; the first material is capable of generating a second material under light irradiation of a first wavelength band, and a solubility of the first material and a solubility of the first light-emitting material are each different from a solubility of the second material in a same solvent; or the first material is generated by a third material under light irradiation of a second wavelength band, and a solubility of the first material and a solubility of the first light-emitting material are each different from a solubility of the third material in a same solvent;
   wherein the first material and the first light-emitting material each include metal nanoparticles and ligands bound to the metal nanoparticles; wherein the ligands included in the first material are same as or different from the ligands included in the first light-emitting material; in a case where the ligands included in the first material are the same as the ligands included in the first light-emitting material, ligands included in the third material are photosensitive ligands; in a case where the ligands included in the first material are different from the ligands included in the first light-emitting material, the ligands included in the first light-emitting material are non-photosensitive ligands, and a solubility of the non-photosensitive ligands is different from the solubility of the second material in the same solvent, or the solubility of the non-photosensitive ligands is different from the solubility of the third material in the same solvent.

2. The light-emitting substrate according to claim 1, wherein an electron mobility of the first material is in a range of $1 \times 10^{-4}$ cm$^2$/V·s to $2 \times 10^{-3}$ cm$^2$/V·s, inclusive, and an absolute value of a lowest unoccupied molecular orbital (LUMO) energy level of the first material is in a range of 3.6 eV to 4.2 eV, inclusive;
   or
   a hole mobility of the first material is in a range of $1 \times 10^{-4}$ cm$^2$/V·s to $2 \times 10^{-3}$ cm$^2$/V·s, inclusive, and an absolute value of a highest occupied molecular orbital (HOMO) energy level of the first material is in a range of 5.1 eV to 6.2 eV, inclusive.

3. The light-emitting substrate according to claim 1, wherein
   the at least one first light-emitting device further includes a carrier transport layer; the carrier transport layer is disposed on a side of the first material layer proximate to the substrate, and is in contact with the first material layer;

or the first material layer serves as the carrier transport layer, and is in direct contact with a first electrode included in the at least one first light-emitting device.

4. The light-emitting substrate according to claim 3, wherein in a case where the at least one first light-emitting device further includes the carrier transport layer, a thickness of the first material layer is less than a thickness of the carrier transport layer;

in a case where the first material layer serves as the carrier transport layer, the thickness of the first material layer is in a range of 50 nm to 70 nm, inclusive.

5. The light-emitting substrate according to claim 3, wherein in a case where the at least one first light-emitting device further includes the carrier transport layer, the material of the first material layer has a carrier transport function, a thickness of the first material layer is in a range of 5 nm to 20 nm, inclusive, and a thickness of the carrier transport layer is in a range of 50 nm to 70 nm, inclusive.

6. The light-emitting substrate according to claim 1, wherein the photosensitive ligands include ligands capable of undergoing a decomposition reaction or a crosslinking reaction under light irradiation;

or the photosensitive ligands include the ligands capable of undergoing the decomposition reaction or the crosslinking reaction under the light irradiation; and a photosensitive ligand in the photosensitive ligands includes any one of 2-(Boc-amino) ethanethiol and Mono-2-(Methacryloyloxy)ethyl succinate (MMES).

7. The light-emitting substrate according to claim 1, wherein the at least one first light-emitting device further includes a carrier transport layer, and the carrier transport layer is disposed on a side of the first material layer proximate to the substrate, and is in contact with the first material layer; a material of the carrier transport layer includes metal nanoparticles and ligands bound to the metal nanoparticles; the metal nanoparticles included in the material of the carrier transport layer are same as or different from the metal nanoparticles included in the first material, and the ligands included in the material of the carrier transport layer are different from the ligands included in the first material.

8. The light-emitting substrate according to claim 1, wherein the plurality of light-emitting devices further include at least one second light-emitting device;

the at least one second light-emitting device further includes a second material layer; the second material layer is disposed on a side, proximate to the substrate, of a light-emitting pattern included in the at least one second light-emitting device, and is in contact with the light-emitting pattern included in the at least one second light-emitting device;

wherein a material of the light-emitting pattern included in the at least one second light-emitting device includes a second light-emitting material, and a material of the second material layer includes a fourth material; the fourth material is capable of generating a fifth material under light irradiation of a third wavelength band, and a solubility of the fourth material and a solubility of the second light-emitting material are each different from a solubility of the fifth material in a same solvent; or the fourth material is generated by a sixth material under light irradiation of a fourth wavelength band, and a solubility of the fourth material and a solubility of the second light-emitting material are each different from a solubility of the sixth material in a same solvent.

9. The light-emitting substrate according to claim 8, wherein the at least one second light-emitting device further includes a third material layer; the third material layer is disposed on a side of the second material layer proximate to the substrate, and is in a same layer as the first material layer; and a thickness of the third material layer is less than a thickness of the first material layer;

and/or the at least one first light-emitting device further includes a fourth material layer; the fourth material layer is disposed on a side, away from the substrate, of the light-emitting pattern included in the at least one first light-emitting device, and is in contact with the light-emitting pattern included in the at least one first light-emitting device; and a thickness of the fourth material layer is less than a thickness of the second material layer.

10. The light-emitting substrate according to claim 8, wherein the plurality of light-emitting devices further include at least one third light-emitting device;

the at least one third light-emitting device further includes a fifth material layer; the fifth material layer is disposed on a side, proximate to the substrate, of a light-emitting pattern included in the at least one third light-emitting device, and is in contact with the light-emitting pattern included in the at least one third light-emitting device;

wherein a material of the light-emitting pattern included in the at least one third light-emitting device includes a third light-emitting material, and a material of the fifth material layer includes a seventh material; the seventh material is capable of generating an eighth material under light irradiation of a fifth wavelength band, and a solubility of the seventh material and a solubility of the third light-emitting material are each different from a solubility of the eighth material in a same solvent; or the seventh material is generated by a ninth material under light irradiation of a sixth wavelength band, and a solubility of the seventh material and a solubility of the third light-emitting material are each different from a solubility of the ninth material in a same solvent.

11. The light-emitting substrate according to claim 10, wherein the at least one third light-emitting device further includes a sixth material layer; the sixth material layer is disposed on a side of the fifth material layer proximate to the substrate, and is in a same layer as the first material layer; and a thickness of the sixth material layer is less than a thickness of the first material layer;

and/or the at least one third light-emitting device further includes a seventh material layer; the seventh material layer is disposed on a side of the fifth material layer proximate to the substrate, and is in a same layer as the second material layer; and a thickness of the seventh material layer is less than a thickness of the second material layer;

and/or the at least one first light-emitting device further includes an eighth material layer; the eighth material layer is disposed on a side, away from the substrate, of the light-emitting pattern included in the at least one first light-emitting device, and is in a same layer as the fifth material layer; and a thickness of the eighth material layer is less than a thickness of the fifth material layer;

and/or the at least one second light-emitting device further includes a ninth material layer; the ninth material layer is disposed on a side, away from the substrate, of the light-emitting pattern included in the at least one second light-emitting device, and is in a same layer as the fifth material layer; and a thickness of the ninth material layer is less than a thickness of the fifth material layer.

12. The light-emitting substrate according to claim 1, wherein for light-emitting devices with different light-emitting colors in the plurality of light-emitting devices, material layers, which are respectively in contact with light-emitting patterns included in the light-emitting devices with different light-emitting colors and respectively disposed on sides, proximate to the substrate, of the light-emitting patterns included in the light-emitting devices with different light-emitting colors, each include metal nanoparticles and ligands bound to the metal nanoparticles; the metal nanoparticles included in each material layer are same, and at least one material layer includes metal nanoparticles doped with other at least one metal.

13. A light-emitting apparatus, comprising the light-emitting substrate according to claim 1.

14. A manufacturing method of a light-emitting substrate, comprising:

forming a plurality of light-emitting devices on a substrate; wherein each light-emitting device includes a first electrode, a second electrode, and a light-emitting pattern formed between the first electrode and the second electrode, and the first electrode is closer to the substrate than the second electrode; and the plurality of light-emitting devices include at least one first light-emitting device; the at least one first light-emitting device further includes a first material layer; the first material layer is formed on a side, proximate to the substrate, of a light-emitting pattern included in the at least one first light-emitting device, and is in contact with the light-emitting pattern included in the at least one first light-emitting device;

wherein a material of the light-emitting pattern included in the at least one first light-emitting device includes a first light-emitting material, and a material of the first material layer includes a first material; the first material is capable of generating a second material under light irradiation of a first wavelength band, and a solubility of the first material and a solubility of the first light-emitting material are each different from a solubility of the second material in a same solvent; or the first material is generated by a third material under light irradiation of a second wavelength band, and a solubility of the first material and a solubility of the first light-emitting material are each different from a solubility of the third material in a same solvent;

wherein the first material and the first light-emitting material each include metal nanoparticles and ligands bound to the metal nanoparticles; wherein the ligands included in the first material are same as or different from the ligands included in the first light-emitting material; in a case where the ligands included in the first material are the same as the ligands included in the first light-emitting material, ligands included in the third material are photosensitive ligands; in a case where the ligands included in the first material are different from the ligands included in the first light-emitting material, the ligands included in the first light-emitting material are non-photosensitive ligands, and a solubility of the non-photosensitive ligands is different from the solubility of the second material in the same solvent, or the solubility of the non-photosensitive ligands is different from the solubility of the third material in the same solvent.

15. The manufacturing method of the light-emitting substrate according to claim 14, wherein the first material is generated by the third material under the light irradiation of the second wavelength band, and a solubility of the first material and a solubility of the first light-emitting material in a first solvent are each less than a solubility of the third material in the first solvent;

forming the at least one first light-emitting device, includes:

sequentially forming a first film and a second film on the substrate; wherein a material of the first film includes the third material; and a material of the second film includes the first light-emitting material; or the material of the second film includes a tenth material that is capable of generating the first light-emitting material under the light irradiation of the second wavelength band;

irradiating a portion of the first film and a portion of the second film that are located in a first region by using light of the second wavelength band, so that the portion of the first film located in the first region generates the first material; wherein the first region is a region where the at least one first light-emitting device is located;

dissolving a portion of the first film located in a second region by using the first solvent, so as to remove the portion of the first film located in the second region and a portion of the second film located in the second region, so that the first material layer and the light-emitting pattern included in the at least one first light-emitting device are obtained; wherein the second region is a remaining region of the plurality of light-emitting devices except the region where the at least one first light-emitting device is located.

16. The manufacturing method of the light-emitting substrate according to claim 15, wherein in a case where the ligands included in the first material are different from the ligands included in the first light-emitting material, the ligands included in the first light-emitting material are insoluble in the first solvent; or in a case where the ligands included in the first material are the same as the ligands included in the first light-emitting material, the first light-emitting material is generated by the tenth material under the light irradiation of the second wavelength band; and ligands included in the third material are photosensitive ligands, and ligands included in the tenth material are photosensitive ligands;

in a case where the ligands included in the first material are different from the ligands included in the first light-emitting material, the ligands included in the third material are photosensitive ligands, the material of the second film includes the first light-emitting material, and the ligands included in the first light-emitting material are insoluble in the first solvent.

17. The manufacturing method of the light-emitting substrate according to claim 14, wherein the plurality of light-emitting devices further include at least one second light-emitting device; the at least one second light-emitting device further includes a second material layer; the second material layer is formed on a side, proximate to the substrate, of a light-emitting pattern included in the at least one second light-emitting device, and is in contact with the light-emitting pattern included in the at least one second light-emitting device;

wherein a material of the light-emitting pattern included in the at least one second light-emitting device includes a second light-emitting material, and a material of the second material layer includes a fourth material; the fourth material is capable of generating a fifth material under light irradiation of a third wavelength band, and a solubility of the fourth material and a solubility of the second light-emitting material are each different from a solubility of the fifth material in a same solvent; or the fourth material is generated by a sixth material under light irradiation of a fourth wavelength band, and a solubility of the fourth material and a solubility of the second light-emitting material are each different from a solubility of the sixth material in a same solvent.

18. The manufacturing method of the light-emitting substrate according to claim 17, wherein the fourth material is generated by the sixth material under the light irradiation of the fourth wavelength band, and a solubility of the fourth material and a solubility of the second light-emitting material in a second solvent are each less than a solubility of the sixth material in the second solvent;

forming the at least one second light-emitting device, includes:

sequentially forming a third film and a fourth film on the substrate on which the first material layer and the light-emitting pattern included in the at least one first light-emitting device are formed; wherein a material of the third film includes the sixth material; and a material of the fourth film includes the second light-emitting material; or the material of the fourth film includes an eleventh material that is capable of generating the second light-emitting material under the light irradiation of the fourth wavelength band;

irradiating a portion of the third film and a portion of the fourth film that are located in a third region by using light of the fourth wavelength band, so that the portion of the third film located in the third region generates the fourth material; wherein the third region is a region where the at least one second light-emitting device is located;

dissolving a portion of the third film located in a fourth region by using the second solvent, so as to remove the portion of the third film located in the fourth region and a portion of the fourth film located in the fourth region, so that the second material layer and the light-emitting pattern included in the at least one second light-emitting device are obtained; wherein the fourth region is a remaining region of the plurality of light-emitting devices except the region where the at least one second light-emitting device is located.

19. A light-emitting substrate, comprising:

a substrate; and a plurality of light-emitting devices disposed on the substrate; wherein each light-emitting device includes a first electrode, a second electrode, and a light-emitting pattern disposed between the first electrode and the second electrode, and the first electrode is closer to the substrate than the second electrode; wherein the plurality of light-emitting devices include at least one first light-emitting device; the at least one first light-emitting device further includes a first material layer; the first material layer is disposed on a side, proximate to the substrate, of a light-emitting pattern included in the at least one first light-emitting device, and is in contact with the light-emitting pattern included in the at least one first light-emitting device;

wherein a material of the light-emitting pattern included in the at least one first light-emitting device includes a first light-emitting material, and a material of the first material layer includes a first material; the first material is capable of generating a second material under light irradiation of a first wavelength band, and a solubility of the first material and a solubility of the first light-emitting material are each different from a solubility of the second material in a same solvent; or the first material is generated by a third material under light irradiation of a second wavelength band, and a solubility of the first material and a solubility of the first light-emitting material are each different from a solubility of the third material in a same solvent;

wherein for light-emitting devices with different light-emitting colors in the plurality of light-emitting devices, material layers, which are respectively in contact with light-emitting patterns included in the light-emitting devices with different light-emitting colors and respectively disposed on sides, proximate to the substrate, of the light-emitting patterns included in the light-emitting devices with different light-emitting colors, each include metal nanoparticles and ligands bound to the metal nanoparticles; the metal nanoparticles included in each material layer are same, and at least one material layer includes metal nanoparticles doped with other at least one metal.

20. The light-emitting substrate according to claim 19, wherein the metal nanoparticles included in each material layer are zinc oxide nanoparticles, and the metal nanoparticles included in the at least one material layer are doped with magnesium metal;

or the metal nanoparticles included in each material layer are zinc oxide nanoparticles doped with magnesium metal with a different doping amount.

* * * * *